(12) United States Patent
Ellis-Monaghan et al.

(10) Patent No.: US 9,882,081 B2
(45) Date of Patent: Jan. 30, 2018

(54) PHOTODETECTOR METHODS AND PHOTODETECTOR STRUCTURES

(71) Applicant: GLOBALFOUNDRIES INC., Grand Cayman (KY)

(72) Inventors: John J. Ellis-Monaghan, Grand Isle, VT (US); John C. S. Hall, New Hartford, CT (US); Marwan H. Khater, Astoria, NY (US); Edward W. Kiewra, South Burlington, VT (US); Steven M. Shank, Jericho, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/227,081

(22) Filed: Aug. 3, 2016

(65) Prior Publication Data

US 2017/0062647 A1    Mar. 2, 2017

Related U.S. Application Data

(62) Division of application No. 14/837,812, filed on Aug. 27, 2015, now Pat. No. 9,466,753.

(51) Int. Cl.
*H01L 27/144* (2006.01)
*H01L 31/0203* (2014.01)
(Continued)

(52) U.S. Cl.
CPC ...... *H01L 31/1808* (2013.01); *H01L 27/1443* (2013.01); *H01L 27/1446* (2013.01);
(Continued)

(58) Field of Classification Search
None
See application file for complete search history.

(56) References Cited

U.S. PATENT DOCUMENTS 6,991,892 B2    1/2006 Block
7,132,656 B2    11/2006 Xu et al.
(Continued)

FOREIGN PATENT DOCUMENTS

TW    I593129    7/2017

OTHER PUBLICATIONS

Office Action Communication, U.S.P.T.O., U.S. Appl. No. 14/837,812, dated May 17, 2016, pp. 1-6.
(Continued)

*Primary Examiner* — Whitney T Moore
(74) *Attorney, Agent, or Firm* — Gibb & Riley, LLC; Michael J. LeStrange, Esq.

(57) ABSTRACT

Disclosed are a method of forming a photodetector and a photodetector structure. In the method, a polycrystalline or amorphous light-absorbing layer is formed on a dielectric layer such that it is in contact with a monocrystalline semiconductor core of an optical waveguide. The light-absorbing layer is then encapsulated in one or more strain-relief layers and a rapid melting growth (RMG) process is performed to crystallize the light-absorbing layer. The strain-relief layer(s) are tuned for controlled strain relief so that, during the RMG process, the light-absorbing layer remains crack-free. The strain-relief layer(s) are then removed and an encapsulation layer is formed over the light-absorbing layer (e.g., filling in surface pits that developed during the RMG process). Subsequently, dopants are implanted through the encapsulation layer to form diffusion regions for PIN diode(s). Since the encapsulation layer is relatively thin, desired dopant profiles can be achieved within the diffusion regions.

19 Claims, 20 Drawing Sheets

(51) Int. Cl.
  *H01L 31/0216*  (2014.01)
  *H01L 31/028*  (2006.01)
  *H01L 31/105*  (2006.01)
  *H01L 31/18*  (2006.01)
  *H01L 31/103*  (2006.01)
  *H01L 27/146*  (2006.01)
  *H01L 31/0232*  (2014.01)

(52) U.S. Cl.
  CPC ........ *H01L 31/0203* (2013.01); *H01L 31/028* (2013.01); *H01L 31/02161* (2013.01); *H01L 31/103* (2013.01); *H01L 31/105* (2013.01); *H01L 31/1872* (2013.01); *H01L 27/14629* (2013.01); *H01L 31/02327* (2013.01)

(56) References Cited

U.S. PATENT DOCUMENTS

| | | |
|---|---|---|
| 7,553,687 B2 | 6/2009 | Reshotko et al. |
| 8,633,067 B2 | 1/2014 | Assefa et al. |
| 8,728,850 B2 | 5/2014 | Ji et al. |
| 8,846,440 B2 | 9/2014 | Assefa et al. |
| 8,994,004 B2 | 3/2015 | Bowers |
| 2013/0285184 A1 | 10/2013 | Li |
| 2014/0185981 A1 | 7/2014 | Assefa et al. |
| 2014/0197507 A1 | 7/2014 | Assefa et al. |
| 2014/0312443 A1 | 10/2014 | Assefa et al. |
| 2015/0171259 A1 | 6/2015 | Hartmann et al. |
| 2015/0311245 A1* | 10/2015 | Yamazaki ......... H01L 27/14632 257/43 |

OTHER PUBLICATIONS

Notice of Allownce Communication, U.S.P.T.O., U.S. Appl. No. 14/837,812, dated Jul. 18, 2016, pp. 1-15.

Chinese Application No. 201610479979.4, Office Action Communication dated Nov. 16, 2017, pp. 1-3.

* cited by examiner

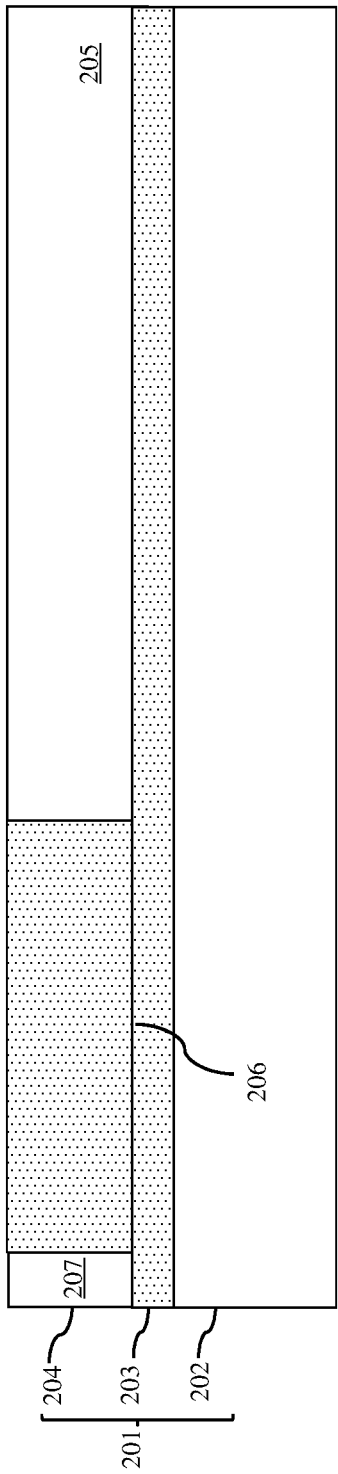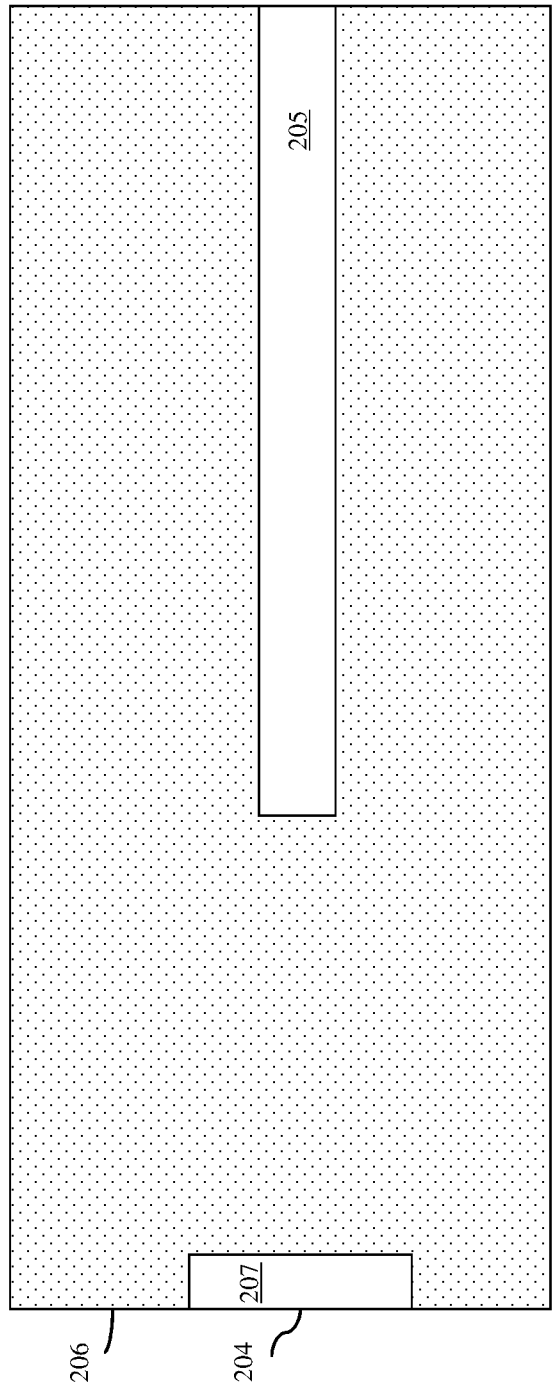

PHOTODETECTOR METHODS AND PHOTODETECTOR STRUCTURES

CROSS-REFERENCE TO RELATED APPLICATIONS

The present invention claims the benefit under 35 U.S.C. § 120 as a divisional of presently pending U.S. patent application Ser. No. 14/837,812 filed on Aug. 27, 2015, now issued as U.S. Pat. No. 9,466,753 on Oct. 11, 2016, the entire teachings of which are incorporated herein by reference.

FIELD OF THE INVENTION

The present invention relates to optoelectronic integrated circuits and, more specifically, to a method of forming a photodetector (e.g., a germanium photodetector) and a photodetector structure with minimal dark current.

BACKGROUND

Generally, optoelectronic integrated circuit chips typically incorporate a variety of optical devices in addition to electronic devices (e.g., complimentary metal oxide semiconductor (CMOS) devices or other electronic devices). One exemplary optical device is a photodetector (also referred to herein as a photosensor or an optical receiver) made up of a layer of a light-absorbing material and one or more photodiodes (e.g., PN diodes or PIN diodes) within the light-absorbing material. The photodetector receives optical signals (i.e., light) from an optical waveguide (e.g., a silicon waveguide) and converts the optical signals into electronic signals (i.e., electrical current) for processing by one or more of the electronic devices. Exemplary light-absorbing materials can include, but are not limited to, silicon, germanium, indium gallium arsenide, lead sulfide and mercury cadmium telluride. These different light-absorbing materials absorb light in different wavelength ranges. Germanium, for example, absorbs light in the infrared wavelength bands (e.g., 700 nm-1 mm) and is commonly used in silicon photonics for receiving light from optical fibers or other on-chip light sources and converting the light to an electrical current at the frequency of modulation.

Unfortunately, current techniques for forming a germanium photodetector often result in the germanium layer having defects and, particularly, cracks and/or surface pits. Such techniques also do not allow for selective control of the dopant profiles within the diffusion regions of the PIN diodes. Defects and/or inadequate dopant profiles can result in a significant amount of undesirable dark current flowing through the photodetector. Those skilled in the art will recognize that the term "dark current" refers to electric current that flows through an optical device, such as a photodetector, in the absence of photons. There is a need in the art for an improved method of forming a photodetector (e.g., a germanium photodetector) with minimal dark current.

SUMMARY

In view of the foregoing, disclosed herein is a method of forming a photodetector (e.g., a germanium photodetector) and a resulting photodetector structure with minimal dark current. In the method, a polycrystalline or amorphous light-absorbing layer can be formed on a dielectric layer such that it is in contact with a monocrystalline semiconductor core of an optical waveguide through an opening in the dielectric layer. The light-absorbing layer can then be encapsulated in one or more strain-relief layers and a rapid melting growth (RMG) process can be performed to crystallize the light-absorbing layer. The strain-relief layer(s) can be tuned for controlled strain relief so that, during the RMG process, the light-absorbing layer remains crack-free. The strain-relief layer(s) can then be removed and a conformal encapsulation layer can be formed over the light-absorbing layer (e.g., filling in any surface pits that developed during the RMG process). Subsequently, dopants can be implanted through the encapsulation layer to form diffusion regions for diode(s) (e.g., PIN diode(s)). Since the encapsulation layer is relatively thin, desired dopant profiles can be achieved within the diffusion regions. By avoiding crack formation in the light-absorbing layer, by filling in surface pits on the light-absorbing layer and/or by achieving desired dopant profiles within the diffusion regions (e.g., N+ and P+ diffusion regions), undesirable dark current is minimized.

More particularly, disclosed is a method of forming a photodetector with minimal dark current.

In the method, a first dielectric layer can be formed on a monocrystalline semiconductor layer. The monocrystalline semiconductor layer can be a semiconductor core of an optical waveguide. That is, the monocrystalline semiconductor layer can be patterned so as to form the semiconductor core of an optical waveguide. An opening can then be formed in the first dielectric layer in order to expose a portion of the semiconductor core.

Next, a light-absorbing layer can be formed on the first dielectric layer and on the monocrystalline semiconductor layer within the opening. This light-absorbing layer can have an amorphous or polycrystalline structure and can have a specific melting temperature.

One or more strain-relief layers can be formed over and, particularly, on the top surface and sidewalls of the light-absorbing layer. The material(s) and thickness(es) of the strain-relief layer(s) can be predetermined in order to minimize mechanical stress within the strain-relief layers both at room temperature and at the specific melting temperature and, thereby to minimize stress on the light-absorbing layer during a subsequent rapid melting growth (RMG) process.

Subsequently, a heating process and, particularly, the RMG process can be performed. That is, the light-absorbing layer can be heated to a temperature above the specific melting temperature and, then, cooled, thereby causing the light-absorbing layer to crystallize (i.e., to become monocrystalline in structure) with the monocrystalline semiconductor layer functioning as the seed layer. It should be noted that, due to the predetermined material(s) and the thickness(es) of the strain-relief layer(s), cracking of the light-absorbing layer during this RMG process is avoided. However, surface pits may still develop on the outer surfaces of the light-absorbing layer, thereby creating voids between the light-absorbing layer and the strain-relief layers. After the RMG process is performed, at least one of the strain-relief layer(s) can be removed.

Next, a relatively thin conformal encapsulation layer can be formed over the light-absorbing layer. If all of the strain-relief layer(s) are removed so as to expose the top surface and sidewalls of the light-absorbing layer, this conformal encapsulation layer can be formed so as to fill in any surface pits that developed on the light-absorbing layer during the RMG process.

Following formation of the conformal encapsulation layer, one or more ion implantation processes can be performed in order to form at least one diode in the light-absorbing layer. Since the conformal encapsulation layer and any remaining strain-relief layer(s) are relatively thin, desired dopant profiles can be achieved within the diffusion regions.

For example, the method can be used to form a germanium photodetector with minimal dark current (e.g., dark current of ~1 uA or less). In this case, a first dielectric layer (e.g., a silicon nitride layer) is formed on a monocrystalline semiconductor layer (e.g., a monocrystalline silicon layer). The monocrystalline semiconductor layer can be a semiconductor core (e.g., a silicon core) of an optical waveguide. That is, the monocrystalline semiconductor layer can be patterned so as to form a semiconductor core (e.g., a silicon core) of an optical waveguide. An opening can then be formed in the first dielectric layer in order to expose a portion of the semiconductor core.

Next, a germanium light-absorbing layer can be formed on the first dielectric layer and on the monocrystalline semiconductor layer within the opening. This germanium light-absorbing layer can have an amorphous or polycrystalline structure and can have a specific melting temperature.

Multiple strain-relief layers can be formed over and, particularly, on the top surface and sidewalls of the light-absorbing layer. These strain-relief layers can be different materials with different thicknesses. The different materials and different thicknesses of the strain-relief layers can be predetermined in order to minimize mechanical stress in the strain-relief layers both at room temperature and at the specific melting temperature and, thereby to minimize stress on the germanium light-absorbing layer during a subsequent rapid melting growth (RMG) process.

For example, the strain-relief layers can include, but are not limited to, a first strain-relief layer (e.g., a silicon nitride layer) and a second strain-relief layer (e.g., a silicon oxide layer). In this case, the different thicknesses of these layers can be predetermined so as to have a ratio of approximately 1:5 in order to minimize the mechanical stress, as described above.

Subsequently, a heating process and, particularly, the RMG process can be performed. That is, the germanium light-absorbing layer can be heated to a temperature above the specific melting temperature and, then, cooled, thereby causing the germanium light-absorbing layer to crystallize (i.e., to become monocrystalline in structure) with the monocrystalline semiconductor layer functioning as the seed layer. It should be noted that, due to the predetermined materials and thicknesses of the strain-relief layers, cracking of the light-absorbing layer during this RMG process is avoided. However, surface pits may still develop on the surfaces of the germanium light-absorbing layer (e.g., on the top surface and sidewalls), thereby creating voids between the germanium light-absorbing layer and the strain-relief layers.

After the RMG process is performed, all of the strain-relief layers can be removed, thereby exposing the top surface and sidewalls of the germanium light-absorbing layer. Then, a relatively thin conformal encapsulation layer can be formed over the germanium light-absorbing layer (i.e., on the exposed top surface and sidewalls). This conformal encapsulation layer can specifically be formed so as to fill in any surface pits on the germanium light-absorbing layer.

Following formation of the conformal encapsulation layer, one or more ion implantation processes can be performed in order to form multiple diodes (e.g., multiple PIN diodes) in the germanium light-absorbing layer. Since the conformal encapsulation layer is relatively thin, desired dopant profiles can be achieved within the diffusion regions. For example, N+ and P+ diffusion regions can be formed with each diffusion region having a dopant profile with a peak dopant concentration located at a depth that is approximately halfway between a bottom surface and a top surface of the light-absorbing layer and a peak dopant concentration amount of at least $1 \times 10^{19}$ atoms/cm3.

Also disclosed herein is photodetector structure having minimal dark current (e.g., a germanium photodetector having dark current of ~1 uA or less).

The photodetector can have a first dielectric layer (e.g., a silicon nitride layer) on a monocrystalline semiconductor layer (e.g., a monocrystalline silicon layer). The monocrystalline semiconductor layer can be a semiconductor core of an optical waveguide. That is, the monocrystalline semiconductor layer can be patterned so as to form a semiconductor core (e.g., a silicon core) of an optical waveguide. An opening can extend vertically through the first dielectric layer to the semiconductor core.

The photodetector can further have a light-absorbing layer on the first dielectric layer and on the monocrystalline semiconductor layer within the opening. The light-absorbing layer can be, for example, a germanium light-absorbing layer and can be monocrystalline in structure. The light-absorbing layer can contain at least one diode. Each diode can have diffusion regions (e.g., a P-type diffusion region and an N-type diffusion region). For example, the light-absorbing layer can have multiple PIN diodes with each PIN diode having a P-type diffusion region, an N-type diffusion region and an intrinsic region positioned laterally between the P-type diffusion region and the N-type diffusion region.

The photodetector can further have a conformal encapsulation layer, which covers the light-absorbing layer (i.e., on the top surface and sidewalls of the light-absorbing layer). As discussed above with regard to the method, this conformal encapsulation layer can be formed following an RMG process that crystallizes the light-absorbing layer and following removal of all of the strain-relief layers to expose the top surface and sidewalls of the light-absorbing layer. Thus, this conformal encapsulation layer fills pits, which are formed on the surfaces of the light-absorbing layer during the RMG process. Furthermore, as discussed above with regard to the method, the diffusion regions of the diode(s) can be formed by performing ion implantation processes immediately following formation of the conformal encapsulation layer. Since the conformal encapsulation layer is relatively thin, desired dopant profiles can be achieved within the diffusion regions. For example, the diode(s) can contain N+ and P+ diffusion regions with each diffusion region having a dopant profile with a peak dopant concentration located at a depth that is approximately halfway between a bottom surface and a top surface of the light-absorbing layer and a peak dopant concentration amount of at least $1 \times 10^{19}$ atoms/cm3.

BRIEF DESCRIPTION OF THE SEVERAL VIEWS OF THE DRAWINGS

The present invention will be better understood from the following detailed description with reference to the drawings, which are not necessarily drawn to scale and in which:

FIG. 3A is a cross-section diagram illustrating a partially completed photodetector structure formed according to the method of FIG. 1;

FIG. 3B is a top view diagram of the partially completed photodetector shown in FIG. 3A;

DETAILED DESCRIPTION

Figure 1:
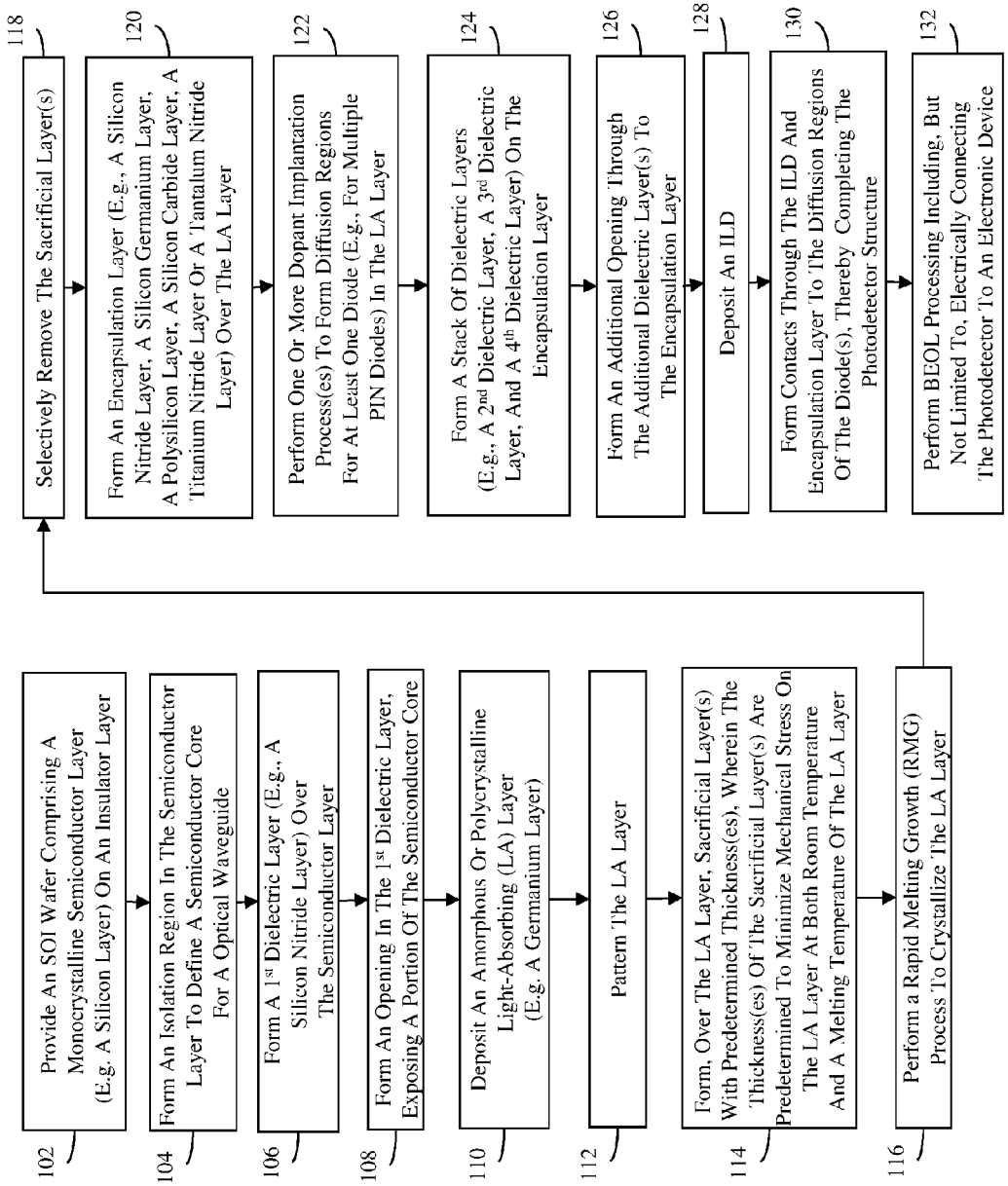
FIG. 1 is a flow diagram illustrating a method of forming a photodetector with minimal dark current.

As mentioned above, optoelectronic integrated circuit chips typically incorporate a variety of optical devices in addition to electronic devices (e.g., complimentary metal oxide semiconductor (CMOS) devices or other electronic devices). One exemplary optical device is a photodetector (also referred to herein as a photosensor or an optical receiver) made up of a layer of a light-absorbing material and one or more photodiodes (e.g., PN diodes or PIN diodes) within the light-absorbing material. The photodetector receives optical signals (i.e., light) from an optical waveguide (e.g., a silicon waveguide) and converts the optical signals into electronic signals (i.e., electrical current) for processing by one or more of the electronic devices. Exemplary light-absorbing materials can include, but are not limited to, silicon, germanium, indium gallium arsenide, lead sulfide and mercury cadmium telluride. These different light-absorbing materials absorb light in different wavelength ranges. Germanium, for example, absorbs light in the infrared wavelength bands (e.g., 700 nm-1 mm) and is commonly used in silicon photonics for receiving light from optical fibers or other on-chip light sources and converting the light to an electrical current at the frequency of modulation.

Current techniques for forming a germanium photodetector typically require formation of a germanium layer on a dielectric layer such that it is in contact with a silicon waveguide through an opening in the dielectric layer. The germanium layer is then encapsulated in relatively thick dielectric layers and a rapid melting growth (RMG) process is performed in order to crystallize the germanium layer. During this RMG process mechanical stress is imposed by the ~5% contraction of the germanium as it passes through the phase change from a polycrystalline or amorphous state to a liquid state during melting and the corresponding ~5% expansion as it re-freezes into a monocrystalline state during cooling. The RMG process can result in the germanium layer having defects and, particularly, cracks due to the mechanical stress as well as surface pits due to the melting. Subsequently, dopants are implanted through the thick dielectric layers in order to form the P-type and N-type diffusion regions for the PIN diodes. Due to the thick dielectric layers, it is difficult to achieve desired dopant profiles within the diffusion regions and, particularly, difficult to achieve desired peak dopant concentration amounts within the diffusion regions and/or difficult to ensure that the peak dopant concentration amounts are located at the centers of the diffusion regions. Defects and/or inadequate dopant profiles within the diffusion regions can result in a significant amount of undesirable dark current flowing through the photodetector. Those skilled in the art will recognize that the term "dark current" refers to electric current that flows through an optical device, such as a photodetector, in the absence of photons. To receive optical signals with high signal to noise ratio, the dark current is required to be low (typically ~1 uA). Thus, there is a need for an improved method of forming a photodetector so that the amount of dark current is minimized and, particularly, for such a method that can be readily integrated into a silicon photonics platform.

In view of the foregoing, disclosed herein are a method of forming a photodetector (e.g., a germanium photodetector) and a resulting photodetector structure with minimal dark current. In the method, a polycrystalline or amorphous light-absorbing layer can be formed on a dielectric layer such that it is in contact with a monocrystalline semiconductor core of an optical waveguide through an opening in the dielectric layer. The light-absorbing layer can then be encapsulated in one or more strain-relief layers and a rapid melting growth (RMG) process can be performed to crystallize the light-absorbing layer. The strain-relief layer(s) can be tuned for controlled strain relief so that, during the RMG process, the light-absorbing layer remains crack-free. The strain-relief layer(s) can then be removed and a conformal encapsulation layer can be formed over the light-absorbing layer (e.g., filling in any surface pits that developed during the RMG process). Subsequently, dopants can be implanted through the encapsulation layer to form diffusion regions for diode(s) (e.g., PIN diode(s)). Since the encapsulation layer is relatively thin, desired dopant profiles can be achieved within the diffusion regions. By avoiding crack formation in the light-absorbing layer, by filling in surface pits on the light-absorbing layer and/or by achieving desired dopant profiles within the diffusion regions (e.g., N+ and P+ diffusion regions), undesirable dark current is minimized.

More particularly, referring to the flow diagram of FIG. 1, disclosed herein is a method of forming a photodetector with minimal dark current (e.g., a germanium photodetector with dark current of ~1 uA or less).

Figure 2:
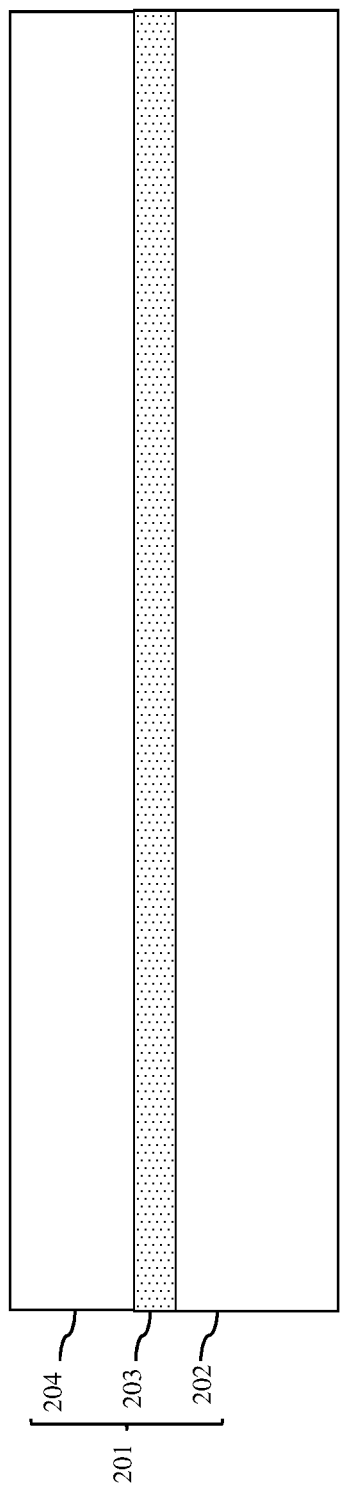
FIG. 2 is a cross-section diagram illustrating a partially completed photodetector structure formed according to the method of FIG. 1.

The method begins with a semiconductor-on-insulator (SOI) wafer 201 (102, see FIG. 2). This SOI wafer 201 can have a semiconductor substrate 202 (e.g., a silicon substrate), an insulator layer 203 on the semiconductor substrate 202 and a monocrystalline semiconductor layer 204 (e.g., a monocrystalline silicon layer) on the insulator layer 203.

An isolation region 206 can be formed in the semiconductor layer 204 above the insulator layer 203 so as to define a semiconductor core 205 (e.g., a silicon core) for an optical waveguide (e.g., a silicon optical waveguide) (104, see FIGS. 3A and 3B). For example, the isolation region 206 can be formed using conventional shallow trench isolation (STI) region formation techniques, wherein a trench is formed (e.g., lithographically patterned and etched) such that it laterally surrounds a portion of the semiconductor layer and, thereby defines the outer edges of the semiconductor core 205 for the optical waveguide. This trench can then be filled with an isolation material and a chemical mechanical polishing (CMP) process can be performed so as to expose the top surface of the patterned semiconductor layer.

It should be noted that the semiconductor core 205 of the optical waveguide can be defined by the isolation region 206 at process 104 such that it is essentially rectangular in shape, as shown in FIG. 3B. Alternatively, the semiconductor core 205 of the optical waveguide can be defined by the isolation region 206 at process 104 so that at least one end is tapered (not shown). In any case, the insulator material for the insulator layer 203 and the isolation material for the isolation region 206 can be the same material and specifically can have a lower refractive index than the semiconductor material of the semiconductor core 205. Thus, for example, if the monocrystalline semiconductor layer 204 is silicon, which has a refractive index of approximately 3.5, then the insulator layer 203 and isolation region 206 can be silicon oxide, which has a refractive index of approximately 1.45.

It should be noted that in addition to defining the semiconductor core 205 of an optical waveguide, the isolation region 206 can further be formed at process 104 so as to define the active regions of other semiconductor devices (e.g., of transistors, etc.) on the same SOI wafer 201. For example, FIGS. 3A and 3B show also show a portion 207 of an active region of semiconductor device being formed on the SOI wafer 201 adjacent to the photodetector.

Optionally, after the active regions for the other semiconductor devices are formed, additional processing can be performed with respect to those other semiconductor devices prior to forming the photodetector structure. For example, gate structures can be formed on the active regions, ion implantation processes can be performed in order to form source/drain regions, etc.

Figure 4:
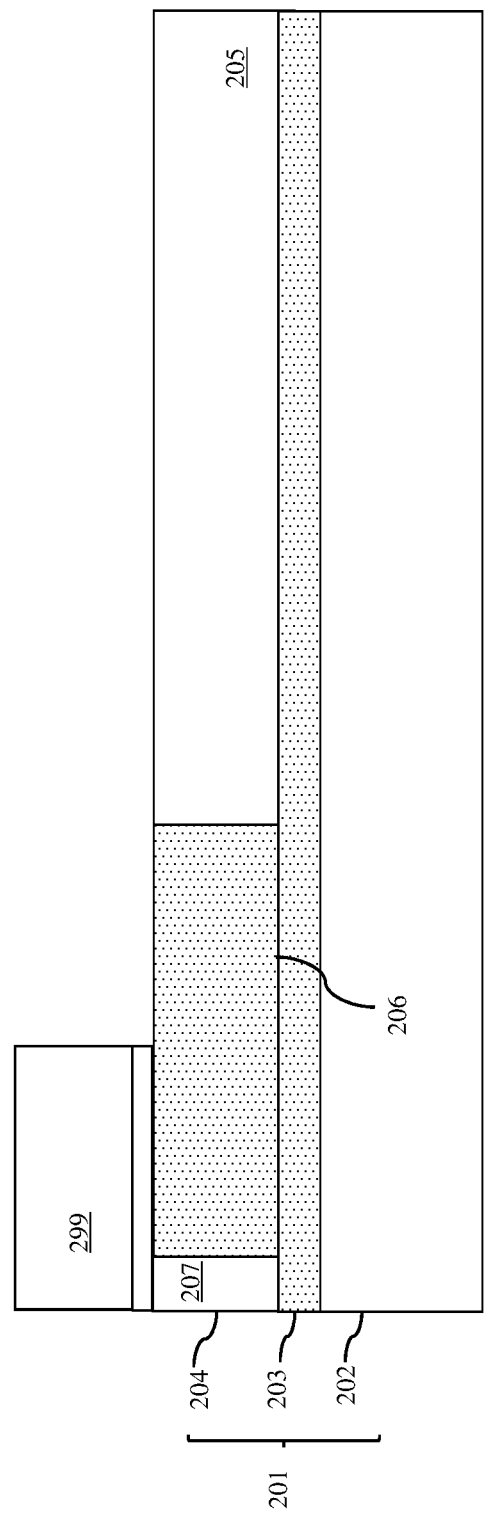
FIG. 4 is a cross-section diagram illustrating a partially completed photodetector structure formed according to the method of FIG. 1.

Next, a protective layer 299 (e.g., a protective oxide layer) can be formed over the regions on the SOI wafer 201 containing the other semiconductor devices and masked etch processes can be performed in order to expose the semiconductor core 205 and the isolation region 206 adjacent to the semiconductor core 205 (e.g., as shown in FIG. 4).

Figure 5:
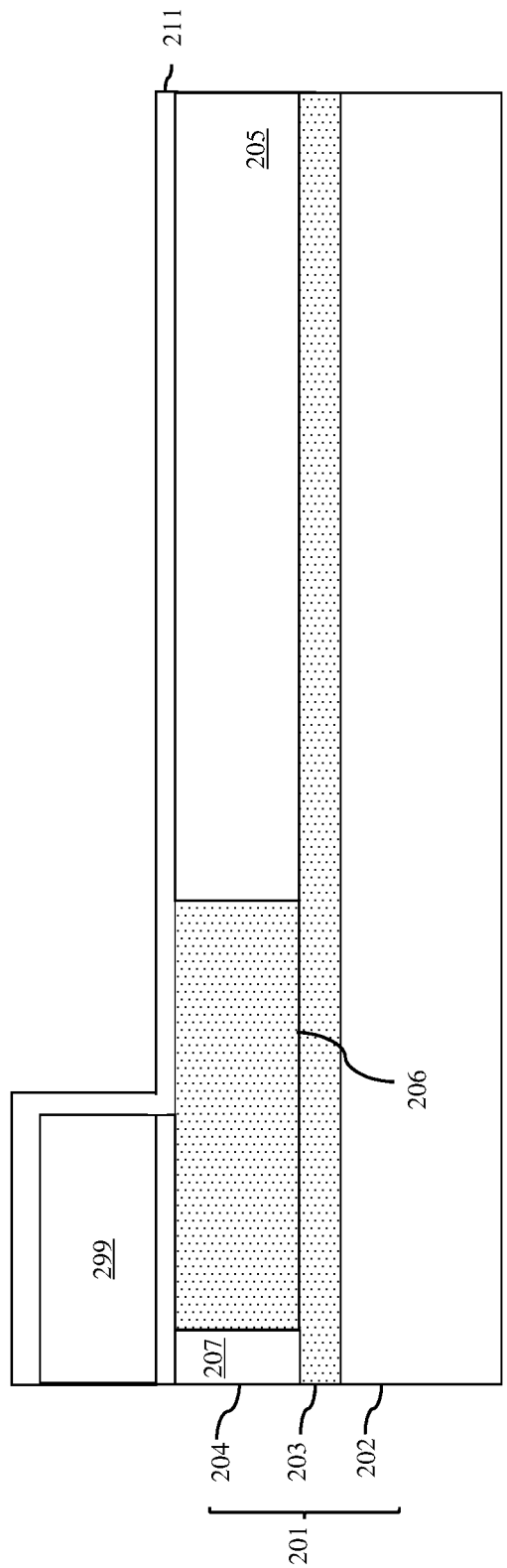
FIG. 5 is a cross-section diagram illustrating a partially completed photodetector structure formed according to the method of FIG. 1.
Figure 6:
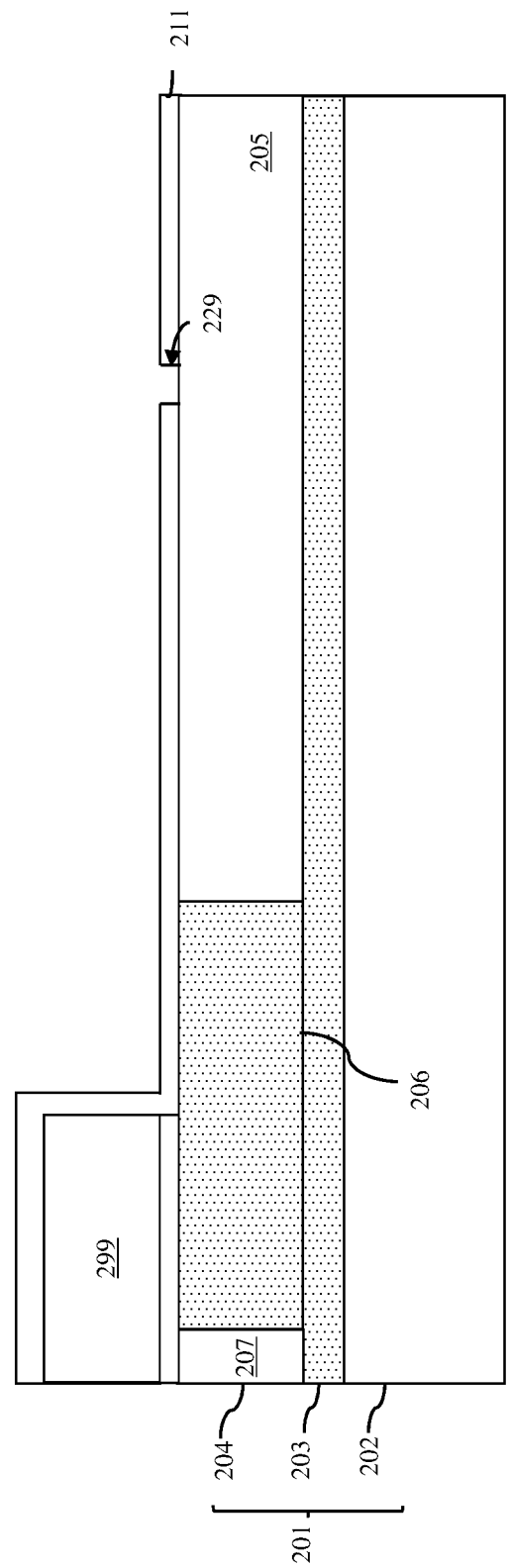
FIG. 6 is a cross-section diagram illustrating a partially completed photodetector structure formed according to the method of FIG. 1.

Next, a first dielectric layer 211 can be formed (e.g., deposited) onto the semiconductor layer 204 such that it is above the isolation region 206 and extends laterally over and is immediately adjacent to the semiconductor core 205 of the optical waveguide (106, see FIG. 5). After the first dielectric layer 211 is formed, an opening 229 can be formed (e.g., lithographically patterned and etched) in the first dielectric layer 211 in order to expose a portion of the monocrystalline semiconductor layer and, particularly, in order to expose a portion of the semiconductor core 205 (108, see FIG. 6).

Figure 7:
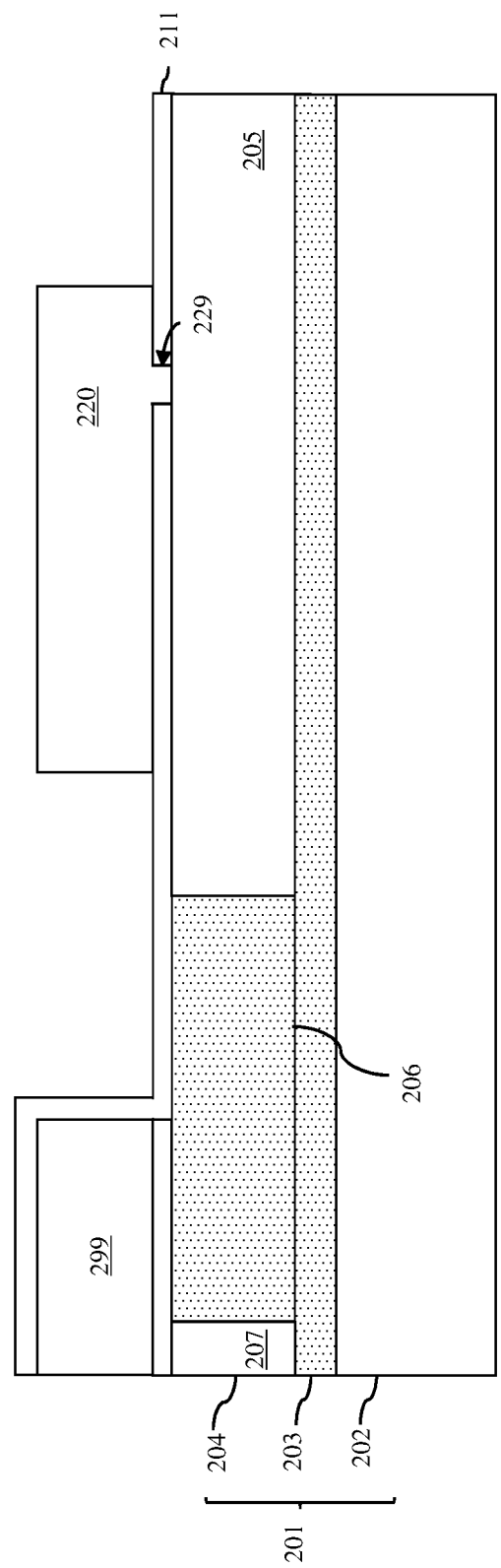
FIG. 7 is a cross-section diagram illustrating a partially completed photodetector structure formed according to the method of FIG. 1.

Then, a light-absorbing layer 220 can be formed on the first dielectric layer and on the monocrystalline semiconductor layer (i.e., the portion of the semiconductor core 205) within the opening 229 (110, see FIG. 7). This light-absorbing layer 220 can be formed, for example, by chemical vapor deposition (CVD), physical vapor deposition (PVD), plasma-enhanced chemical vapor deposition (PECVD) or any other suitable deposition process. This light-absorbing layer 220 can be deposited as an intrinsic light-absorbing layer (i.e., a light-absorbing layer that is undoped so as to have neither P-type, nor N-type conductivity), which is either amorphous or polycrystalline structure. In any case, this light-absorbing layer 220 can have a specific melting temperature. This light-absorbing layer 220 can be, for example, a germanium layer with a specific melting temperature of 950° C. Alternatively, this light-absorbing layer 220 can be a silicon layer, a silicon germanium layer, an indium gallium arsenide layer or any other suitable light-absorbing layer that can be deposited in an amorphous or polycrystalline state and can be crystallized during a subsequent rapid melting growth (RMG) process, as described in greater detail below at process 116. It should be noted that this light-absorbing layer 220 can be lithographically patterned and etched to define the dimension of the photodetector (e.g., the length and width of the photodetector) (112). However, such processes must be performed so as to ensure that the light-absorbing layer 220 remains aligned above and in contact with the semiconductor core 205 because the semiconductor core 205 will function as the seed layer for crystallization during the subsequent RMG process.

One or more strain-relief layers can be formed over and, particularly, stacked above the top surface and on the sidewalls of the light-absorbing layer 220 (114). The design of the strain-relief layer(s) (e.g., the number of strain-relief layers, the material(s) used for the strain-relief layer(s) and the thickness(es) of the strain-relief layer(s)) can be selectively tuned for controlled strain relief on the light-absorbing layer 220 during the subsequent RMG process.

For example, a single strain-relief layer can be formed at process 114 over the light-absorb layer 220 and the material and the thickness of this single strain-relief layer can be predetermined in order to minimize mechanical stress within the strain-relief layers both at room temperature and at the specific melting temperature of the light-absorbing layer 220 (e.g., at 950° C. in the case of a germanium light-absorbing layer) and, thereby to minimize stress on that light-absorbing layer 220 during the subsequent RMG process. It should be noted that in the case of the single strain-relief layer the material should be selected to also function as a barrier layer, which prevents inter-diffusion of germanium and silicon during the subsequent RMG process.

Figure 8:
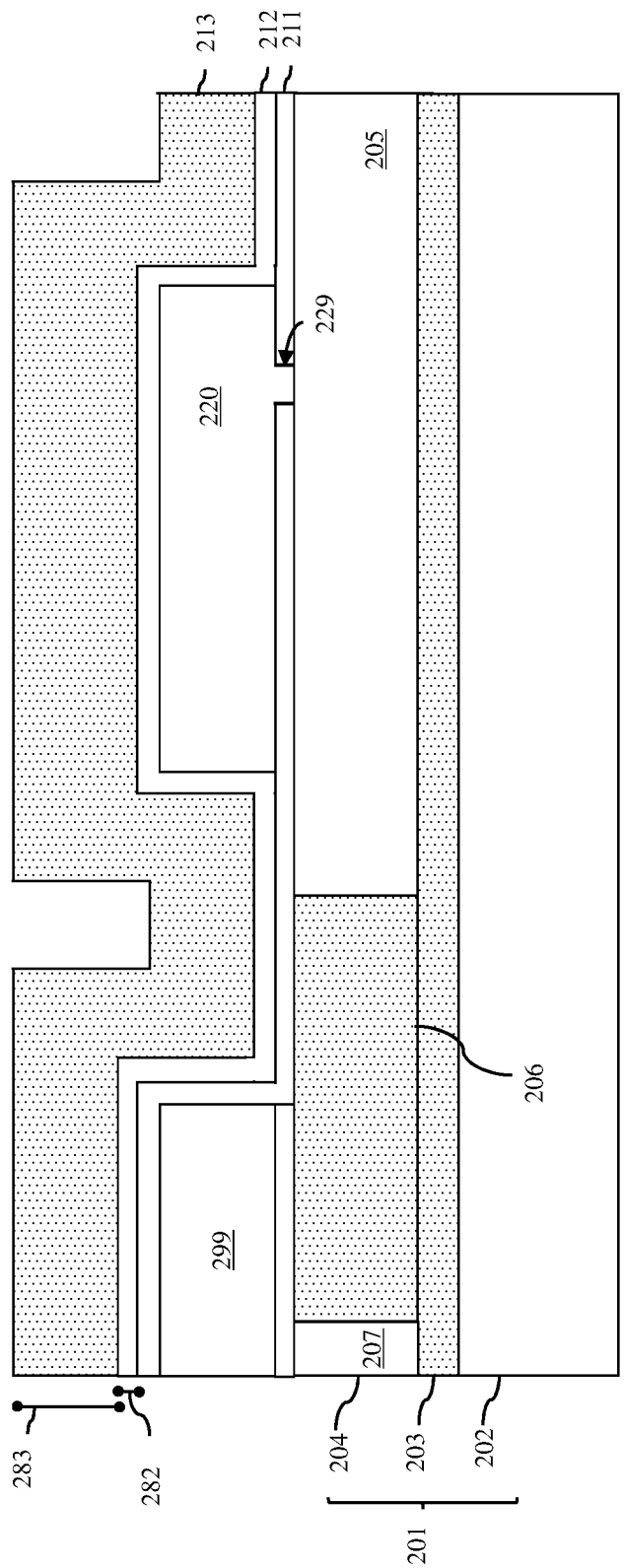
FIG. 8 is a cross-section diagram illustrating a partially completed photodetector structure formed according to the method of FIG. 1.

Alternatively, as shown in FIG. 8, multiple strain-relief layers can be formed at process 114 in over and, particularly, stacked on the top surface and sidewalls of the light-absorbing layer 220. These strain-relief layers can be different materials (e.g., different dielectric materials) and can have different thicknesses, which are similarly predetermined in order to minimize mechanical stress within the strain-relief layers both at room temperature and at the specific melting temperature of the light-absorbing layer 220 (e.g., at 950° C. in the case of a germanium light-absorbing layer) and, thereby to minimize stress on that light-absorbing layer 220 during the subsequent RMG process.

Figure 9:
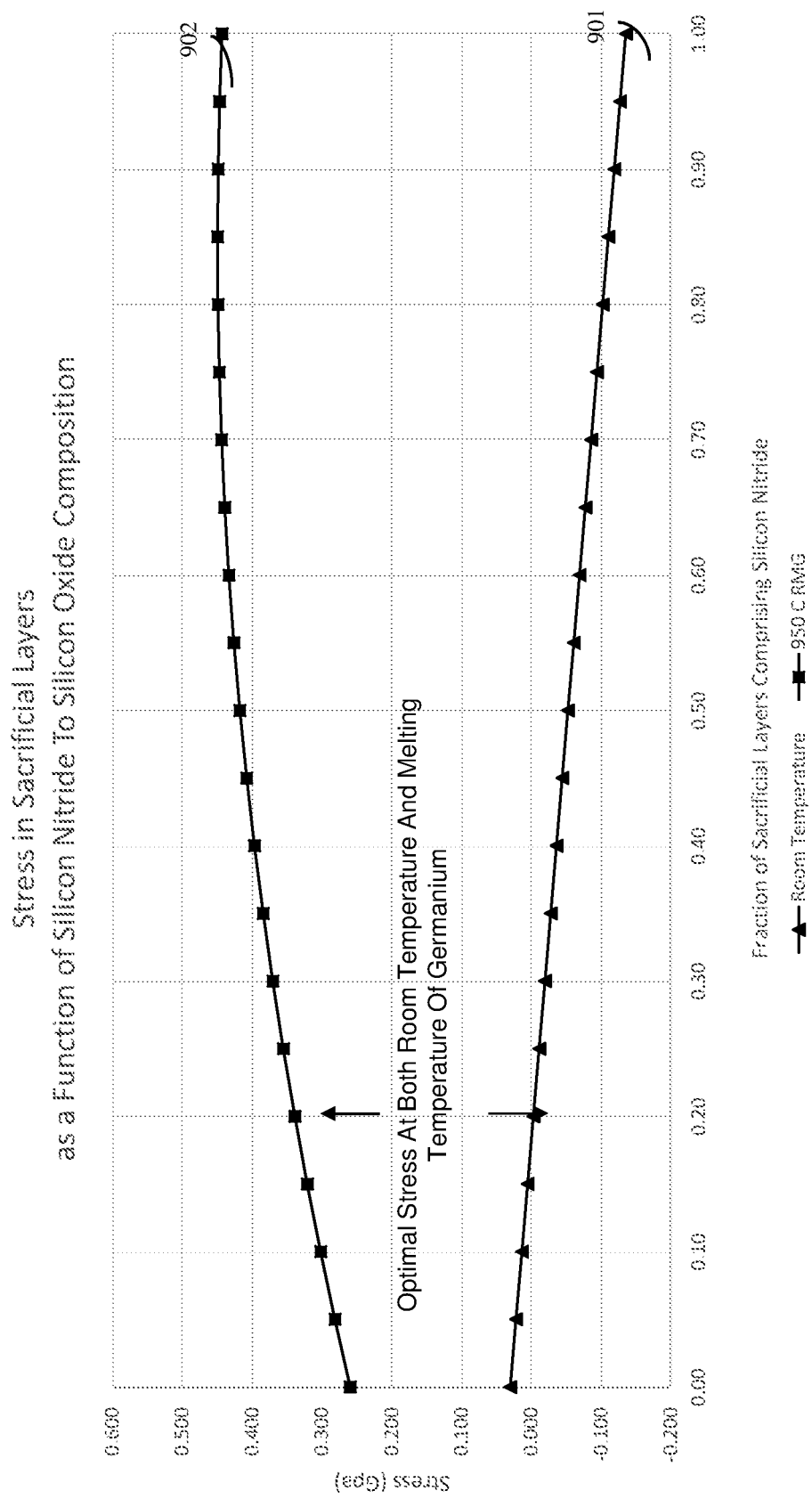
FIG. 9 shows a curve illustrating changes in the amount of stress in the strain-relief layers at room temperature as a function of changes in the portion of the strain-relief layers made up of silicon nitride and another curve illustrating changes in the amount of stress in these strain-relief layers at the melting temperature of the light-absorbing layer as a function of changes in the portion of the strain-relief layers made up of silicon nitride.

Exemplary strain-relief layers can include, but are not limited to, a first strain-relief layer 212 and a second strain-relief layer 213. The first strain-relief layer 212 can function as a barrier layer. That is, this first strain-relief layer 212 can be a specific material and can have a specific thickness sufficient to prevent inter-diffusion of germanium and silicon during the subsequent RMG process. For example, the first strain-relief layer 212 can be a silicon nitride layer with a first predetermined thickness 282 in the range of 200-600 Angstroms (Å) (e.g., the first predetermined thickness 282 can be 400 Å). The second strain-relief layer 213 can be, for example, a silicon dioxide layer having a second predetermined thickness 283 that is greater than the first predetermined thickness 282 of the first strain-relief layer 212. In this case, the different thicknesses 282, 283 of the first strain-relief layer 212 (e.g., the silicon nitride layer) and the second strain-relief layer 213 (e.g., the silicon oxide layer) and, particularly, the ratio of the different thicknesses can be predetermined in order to minimize mechanical stress in the strain-relief layers 212-213 both at room temperature and at the specific melting temperature (e.g., at 950° C. in the case of a germanium light-absorbing layer) and, thereby to minimize stress on that light-absorbing layer 220 during the subsequent RMG process. Specifically, the silicon nitride and silicon oxide layer 212-213 can have some total thickness, with the silicon nitride layer making up a first fraction of that total thickness and with the silicon oxide layer 213 making up a second fraction of that total thickness. The graph of FIG. 9 shows a first curve 901 illustrating changes in the amount of stress in these strain-relief layers 212-213 at room temperature as a function of changes in the first fraction (i.e., as a function of changes in the portion of the strain-relief layers made up of silicon nitride) and, thereby as a function of changes in the ratio of the thickness 282 of the silicon nitride layer 212 to the thickness 283 of the silicon oxide layer 213. The graph of FIG. 9 further shows a second curve 902 illustrating changes in the amount of stress in these strain-relief layers 212-213 at the melting temperature of the germanium light-absorbing layer (e.g., at 950° C.) as a function of changes in the first fraction (i.e., as a function of changes in the portion of the strain-relief layers made up of silicon nitride) and, thereby as a function of changes in the ratio of the thickness 282 of the silicon nitride layer 212 to the thickness 283 of the silicon oxide layer 213. As illustrated in the curves 901-902, the changes in the amount of stress in the strain-relief layers 212-213 as a function of the changes in the first fraction differs depending upon whether the structure is at room temperature or at the melting temperature of the germanium light-absorbing layer (e.g., at 950° C.). That is, the stress range at room temperature is from −0.14 to +0.14 gigapascals (GPa), whereas the stress range in the strain-relief layers 212-213 at 950° C. is from 0.30 to 0.44 GPa. Furthermore, when first fraction is approximately 0.20/1.00 or, more particularly, when the ratio of the thickness 282 of the silicon nitride layer 212 to the thickness 283 of the silicon oxide layer 213 is approximately 1:5, the amount of stress in the strain-relief layers 212-213 is essentially minimized both at room temperature and the melting temperature of the germanium light-absorbing layer (e.g., at 950° C.). Thus, for example, if the first strain-relief layer 212 (e.g., the silicon nitride layer) has a first predetermined thickness 282 of 400 Å (see discussion above regarding required thickness to function as a barrier layer), then the second strain-relief layer 213 (e.g., the silicon oxide layer) should have a second predetermined thickness of 2000 Å. This ratio of 1:5 will also ensure that, the during the subsequent RMG process, the amount of stress on the germanium light-absorbing layer 220 is also minimized. Specifically, this ratio of 1:5 ensures that the stress on the strain-relief layers is compressive (−0.003Gpa) at room temperature and minimally tensile (0.34 GPa) at 950° C. It should be noted that tensile stress amounts on the strain-relief layers 212-213 of 0.30 to 0.44 GPa at 950° C. are all less than the tensile stress amount of 0.52 Gpa typically seen in non-sacrificial encapsulation layers used in prior art methods to encapsulate germanium during an RMG process and the tensile stress of amount of 0.34 GPa at 950° C. is 35% less that that 0.52 Gpa tensile stress amount.

Figure 10:
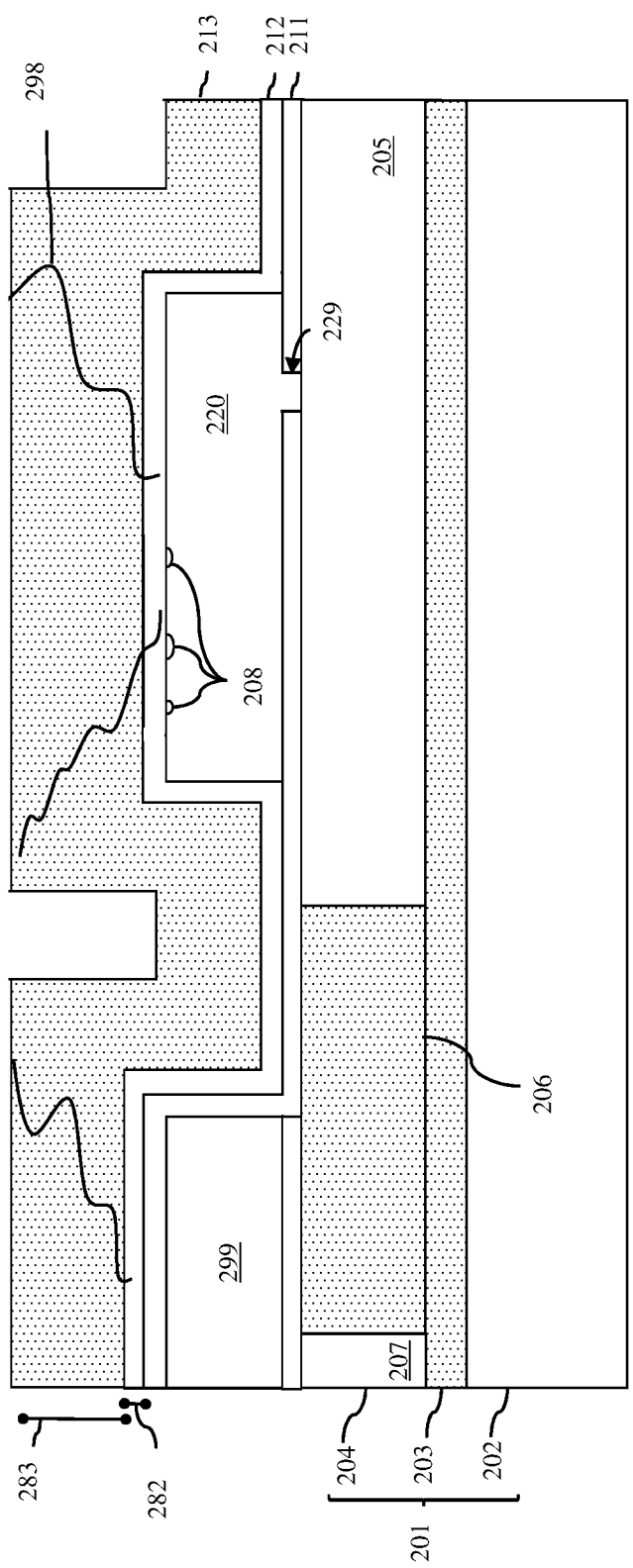
FIG. 10 is a cross-section diagram illustrating a partially completed photodetector structure formed according to the method of FIG. 1.

Once the strain-relief layer(s) are formed at process 114, a heating process and, particularly, the rapid melting growth (RMG) process can be performed (116, see FIG. 10). That is, the light-absorbing layer 220 can be heated to its specific melting temperature and, then, cooled, thereby causing the light-absorbing layer 220 to crystallize (i.e., to become monocrystalline in structure) with the monocrystalline semiconductor layer 204 functioning as the seed layer. It should be noted that, during this RMG process, cracks 298 may appear in the strain-relief layer(s). However, due to the predetermined material(s) and thickness(es)of the strain-relief layer(s), cracking of the light-absorbing layer 220 is avoided, minimizing dark current in the resulting photodetector. It should further be noted that, while cracking of the light-absorbing layer 220 is prevented, surface pits 208 may still develop on the top surface and sidewalls of the light-absorbing layer 220, thereby creating voids between the light-absorbing layer 220 and the strain-relief layer(s).

Figure 11:
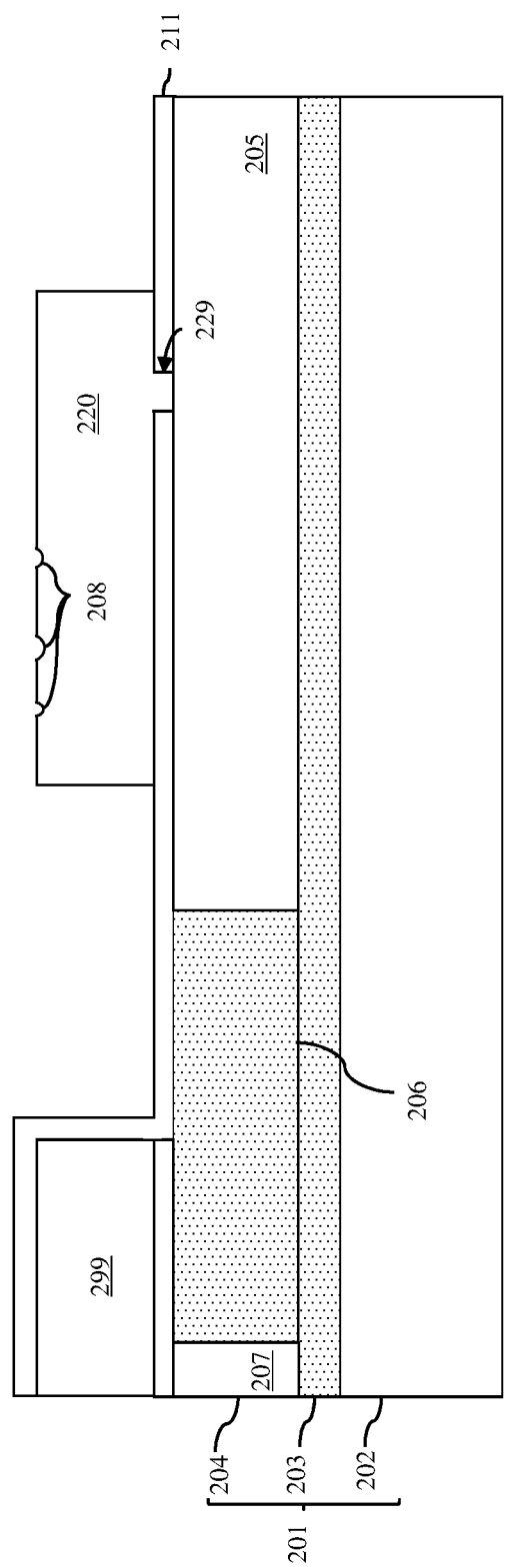
FIG. 11 is a cross-section diagram illustrating a partially completed photodetector structure formed according to the method of FIG. 1.

After the RMG process is performed, some or all of the strain-relief layer(s) can be selectively removed (118). That is, as illustrated in FIG. 11, all of the strain-relief layer(s) can be selectively removed at process 118, thereby exposing the top surface and sidewalls of the light-absorbing layer 220. For example, when the first and second strain-relief layers 212-213 are a silicon nitride layer and a silicon oxide layer, respectively, the silicon oxide layer can be removed using a hydrofluoric acid (HF) etch process and the silicon nitride layer can be removed using a reactive ion etch (RIE) process. Alternatively, if multiple strain-relief layers were formed at process 114, at least one, but not necessarily all, of the strain-relief layers can be selectively removed in order to at least reduce the total thickness of the material above the light-absorbing layer 220 (not shown).

Figure 12:
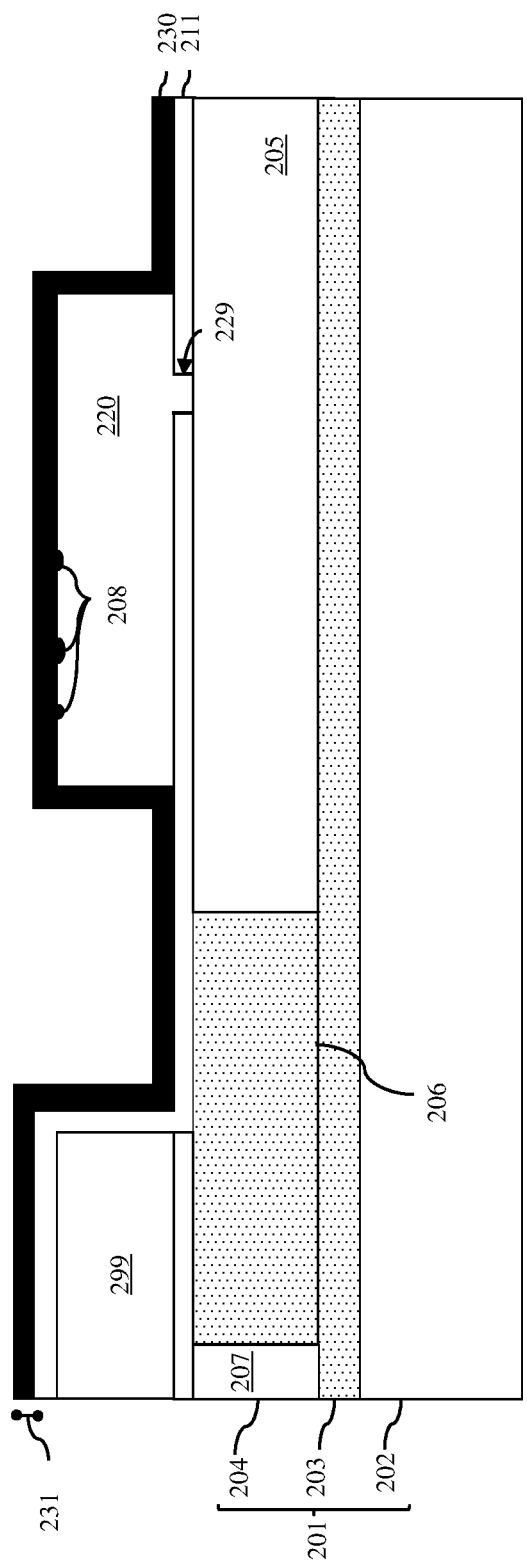
FIG. 12 is a cross-section diagram illustrating a partially completed photodetector structure formed according to the method of FIG. 1.

Next, a conformal encapsulation layer 230 can be formed over the light-absorbing layer 220 (120). This conformal encapsulation layer 230 can be formed, for example, by chemical vapor deposition (CVD), physical vapor deposition (PVD) process, plasma-enhanced chemical vapor deposition (PECVD) or any other suitable deposition process. Since this conformal encapsulation layer 230 is formed after the RMG process, it does not need to be optimized for strain reduction during RMG and instead can be optimized for one or more other functions, for example, surface pit fill, electrical, optical, barrier, and/or etch stop functions. For example, as illustrated in FIG. 12, if the top surface and sidewalls of the light-absorbing layer 220 are exposed at process 118, this conformal encapsulation layer 230 can be formed so as to fill in any surface pits 208 on the top surface and/or sidewalls of the light-absorbing layer 220 and, thereby to minimize dark current in the resulting photodetector. This conformal encapsulation layer 230 could be a silicon nitride layer or any other suitable layer, such as a polysilicon layer, a silicon germanium layer, a silicon carbide layer, a titanium nitride layer, a tantalum nitride layer or any combination thereof. In any case, this conformal encapsulation layer 230 should be formed so as to be relatively thin. For example, this conformal encapsulation layer 230 can be deposited so as to have a third predetermined thickness 231 in the range of 200-600 Å (e.g., the third predetermined thickness can be approximately 400 Å).

Figure 13:
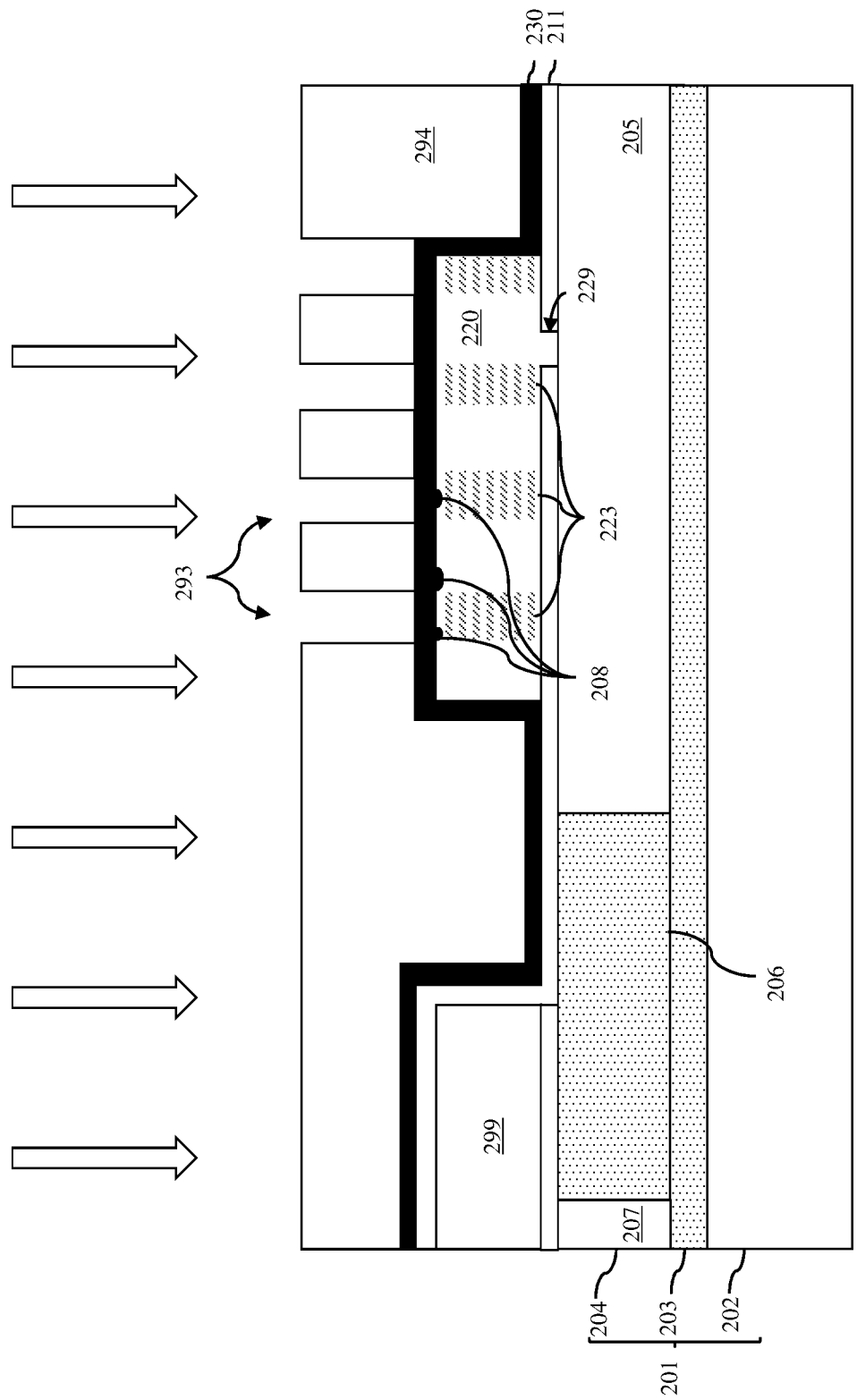
FIG. 13 is a cross-section diagram illustrating a partially completed photodetector structure formed according to the method of FIG. 1.
Figure 14:
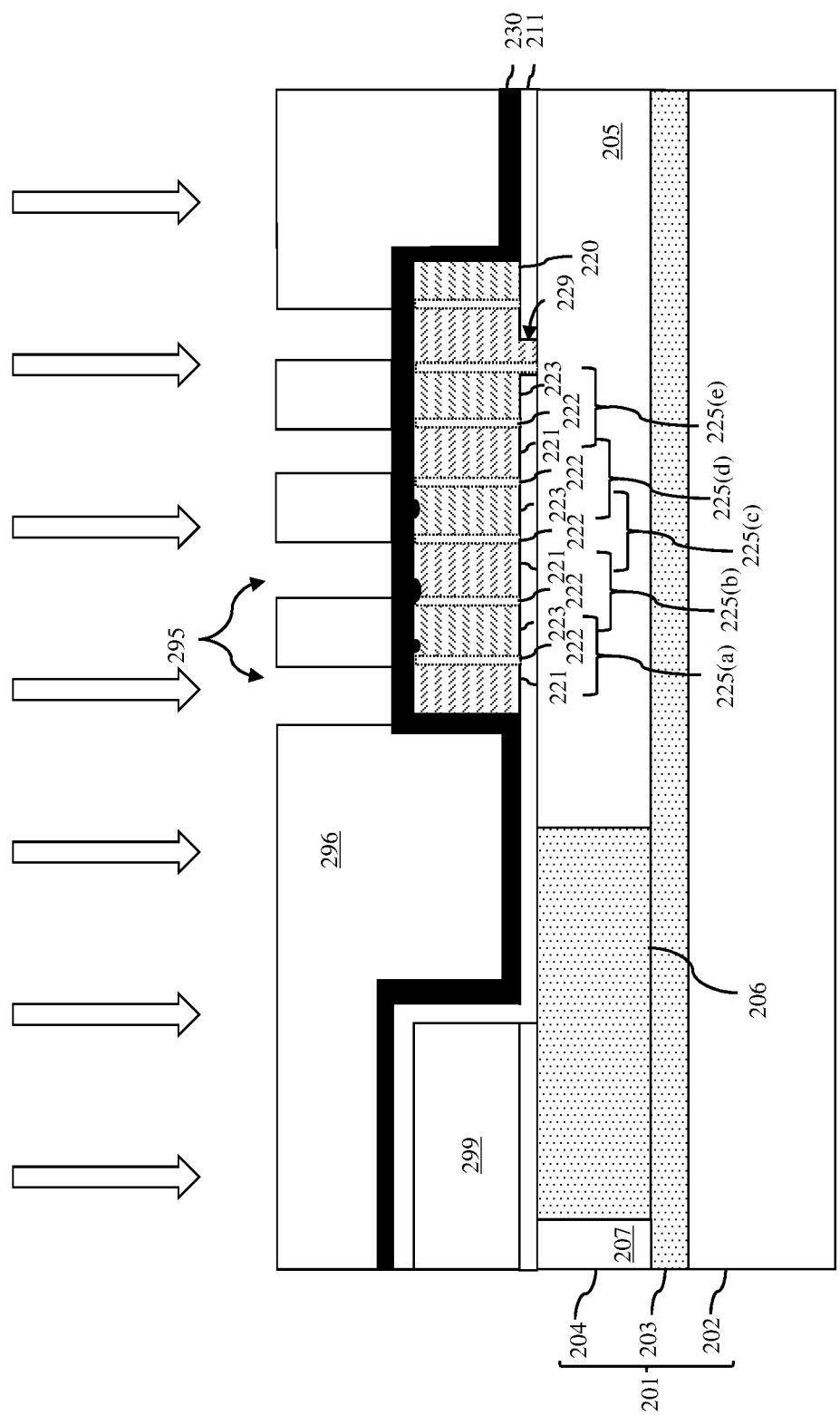
FIG. 14 is a cross-section diagram illustrating a partially completed photodetector structure formed according to the method of FIG. 1.

Following formation of the conformal encapsulation layer, ion implantation processes can be performed in order to form at least one diode in the light-absorbing layer 220 (122). Specifically, as illustrated in FIG. 13, a mask layer 294 can be formed on the encapsulation layer 230. Opening(s) 293 can be formed (e.g., lithographically patterned and etched) into the mask layer 294 so as to be aligned over desired location(s), within the light-absorbing layer 220, for diffusion region(s) 223 having a first-type conductivity (e.g., a P-type conductivity). Then, an ion implantation process can be performed in order to implant a first-type conductivity dopant into the light-absorbing layer 220 through the opening(s) 293, thereby creating the first-type conductivity diffusion region(s) 223. For example, a P-type dopant (e.g., a Group III dopant, such as boron or indium) can be implanted to create P-type diffusion region(s). Next, as illustrated in FIG. 14, the mask layer 294 can be stripped and another mask layer 296 can be formed on the encapsulation layer 230. Opening(s) 295 can be formed (e.g., lithographically patterned and etched) into the mask layer 296 so as to be aligned over desired location(s) within the light-absorbing layer 220 for diffusion region(s) 221 having a second-type conductivity (e.g., an N-type conductivity). These opening(s) 295 can be offset from the diffusion region(s) 223. Then, another ion implantation process can be performed to implant a second-type conductivity dopant into the light-absorbing layer 220 through the opening(s) 295, thereby creating the second-type conductivity diffusion region(s) 221 adjacent to the first-type conductivity diffusion region(s) 223. For example, an N-type dopant (e.g., a Group V dopant, such as arsenic, phosphorous or antimony) can be implanted to create N-type diffusion region(s). Each pair of adjacent diffusion regions with different type conductivities will form a diode (e.g., see diodes 225(a)-(e)). Optionally, each adjacent pair of diffusion regions having different conductivity types can be patterned so as to be separated by an intrinsic region 222 (i.e., an un-doped region) such that each diode within the light-absorbing layer 220 is a PIN junction diode.

It should be noted that, since the conformal encapsulation layer 230 is relatively thin (e.g., 400 Å, as discussed above), the method disclosed herein allows for more selective control over diode diffusion region formation within the light-absorbing layer 220 during the above-described ion implantation processes as compared to prior art methods. For example, because the conformal encapsulation layer 230 is relatively thin, a relatively high implant dose of at least 1×1014 atoms/cm2 can be used during the ion implantation processes described above to create the P-type diffusion region(s) 223 and the N-type diffusion region(s) 221. Thus, each diffusion region 221 and 223 can be formed so as to have a dopant profile with a peak dopant concentration amount of at least 1×1019 atoms/cm3. Furthermore, because the conformal encapsulation layer 230 is relatively thin, the ion implantation processes described above to create the P-type diffusion region(s) 223 and the N-type diffusion region(s) 221 do not need to be high-energy ion implantation process. Instead, these ion implantation processes can be medium-energy or even low-energy ion implantation processes (e.g., with energy ranges between 20 and 60 KeV for the case of boron implants and between 50 and 150 KeV for the case of phosphorous implants) to reduce implant scattering and, additionally, the energy amount can be selectively controlled in order to achieve, with each diffusion region 221 and 223, a dopant profile having the peak dopant concentration located at a depth that is approximately halfway between the bottom surface and the top surface of the light-absorbing layer 220. Finally, because the conformal encapsulation layer 230 is relatively thin, the mask layers 294 and 296 can also be relatively thin (e.g., between 0.3 and 0.7 microns (µm), such as 0.5 µm) such that the widths of the openings 293 and 295, which are lithographically patterned and etched into those layers, can be relatively small (e.g., between 0.15 and 0.21 µm, such as 0.18 µm). Since the width of the openings 293 and 295 can be relatively small, the number of diffusion regions within the light-absorbing layer 220 of a given length and, thereby the number of diodes within a light-absorbing layer 220 of a given length can be increased. For example, a light-absorbing layer 220 with a length of 20 µm can contain up to 55 diodes. By ensuring that the diffusion regions 221 and 223 of the diode(s) have a desired dopant profile (e.g., a desired relatively high peak concentration amount of at least 1×1019 atoms/cm3, which is located approximately halfway between the bottom and top surfaces of the light-absorbing layer 220) and by maximizing the number of diodes per given length of the light-absorbing layer 220, the disclosed method minimizes the amount of dark current that will flow through the resulting photodetector. For example, in the case of a germanium light-absorbing layer 220, this amount of dark current can be reduced to ~1 uA or less.

Figure 15:
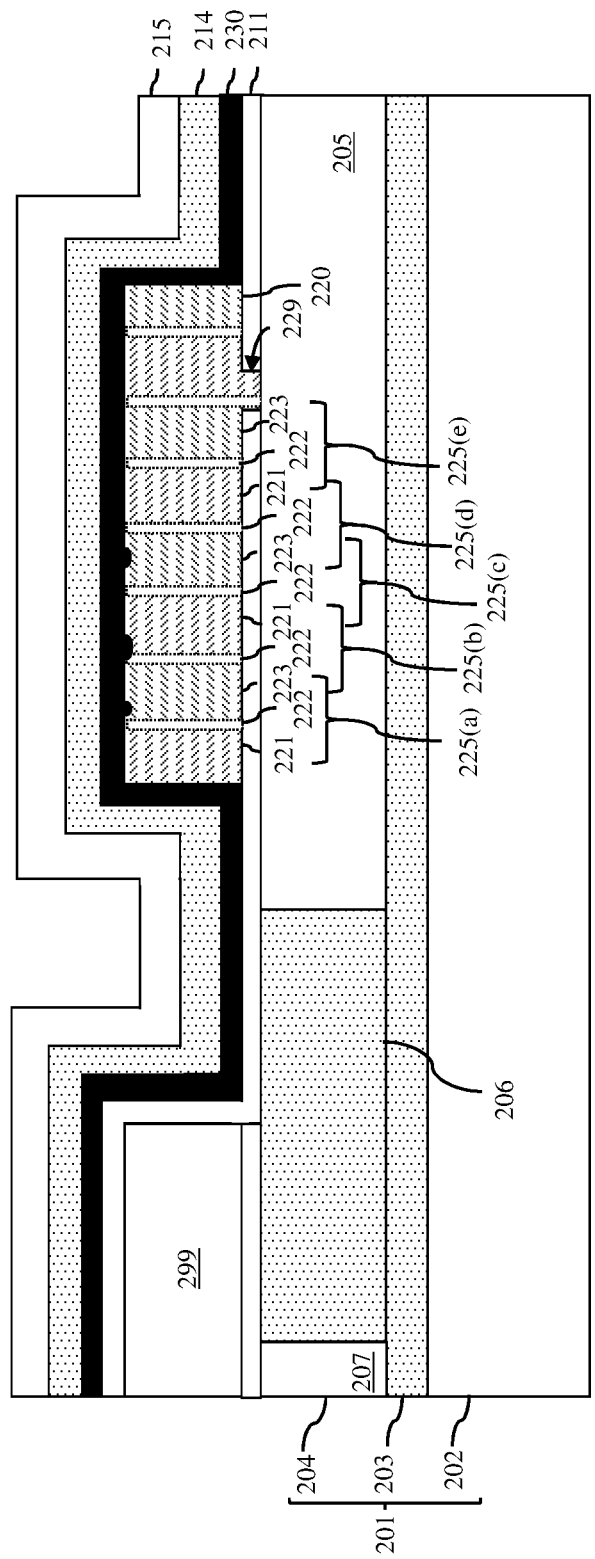
FIG. 15 is a cross-section diagram illustrating a partially completed photodetector structure formed according to the method of FIG. 1.
Figure 16:
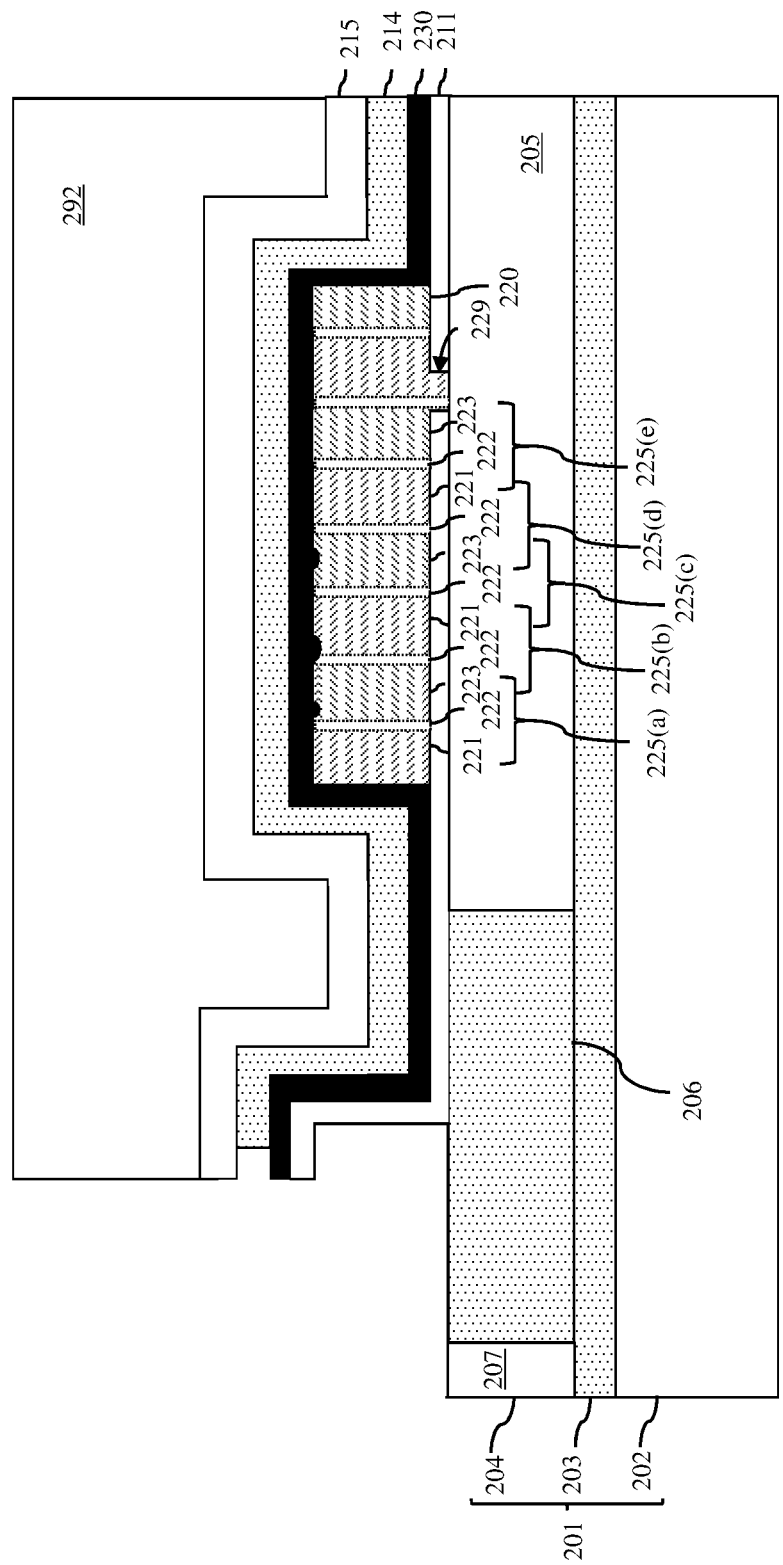
FIG. 16 is a cross-section diagram illustrating a partially completed photodetector structure formed according to the method of FIG. 1.
Figure 17:
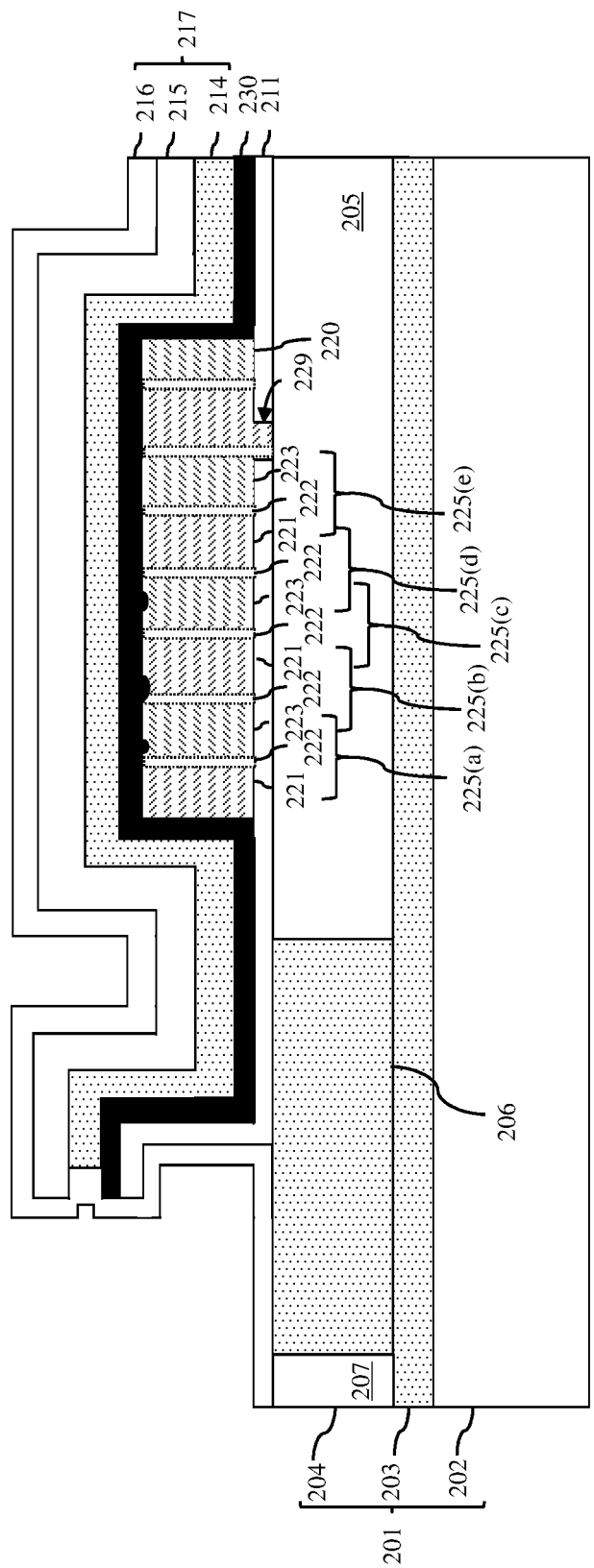
FIG. 17 is a cross-section diagram illustrating a partially completed photodetector structure formed according to the method of FIG. 1.

After the ion implantation processes, the mask layer 296 can be selectively removed and a stack of dielectric layers can be formed on the encapsulation layer 230 (124). For example, a second dielectric layer 214 can be formed immediately adjacent to the encapsulation layer 230 and a third dielectric layer 215 can be formed on the second dielectric layer 214 (see FIG. 15). The encapsulation layer 230 can be a different material than the second dielectric layer 214 such that the encapsulation layer 230 functions as an etch stop layer during subsequent processing. For example, as mentioned above, the encapsulation layer 230 can be silicon nitride, polysilicon, silicon germanium, silicon carbide, titanium nitride, tantalum nitride or any combination thereof. The second dielectric layer 214 can be a silicon oxide layer. Furthermore, the third dielectric layer 215 and the second dielectric layer 214 can be different dielectric materials. For example, the third dielectric layer 215 can be a silicon nitride layer. The second and third dielectric layers 214-215 can, for example, be optimized for downstream processing and/or optical characteristics (e.g., so that they have a lower refractive index than the light-absorbing layer). Optionally, before any additional layers in the stack are formed, a mask 292 can be formed over the partially completed photodetector structure to allow additional processing to be performed with respect to other semiconductor devices including, for example, removal of the protective layer 299, silicide formation, etc. (see FIG. 16). Following processing of the other semiconductor devices, the mask 292 can be removed and a fourth dielectric layer 216 (e.g., a conformal barrier layer, such as a conformal silicon nitride layer) can be formed on the third dielectric layer 215 and extending laterally over the other semiconductor devices, thereby completing the stack 217 of dielectric layers (see FIG. 17).

Figure 18:
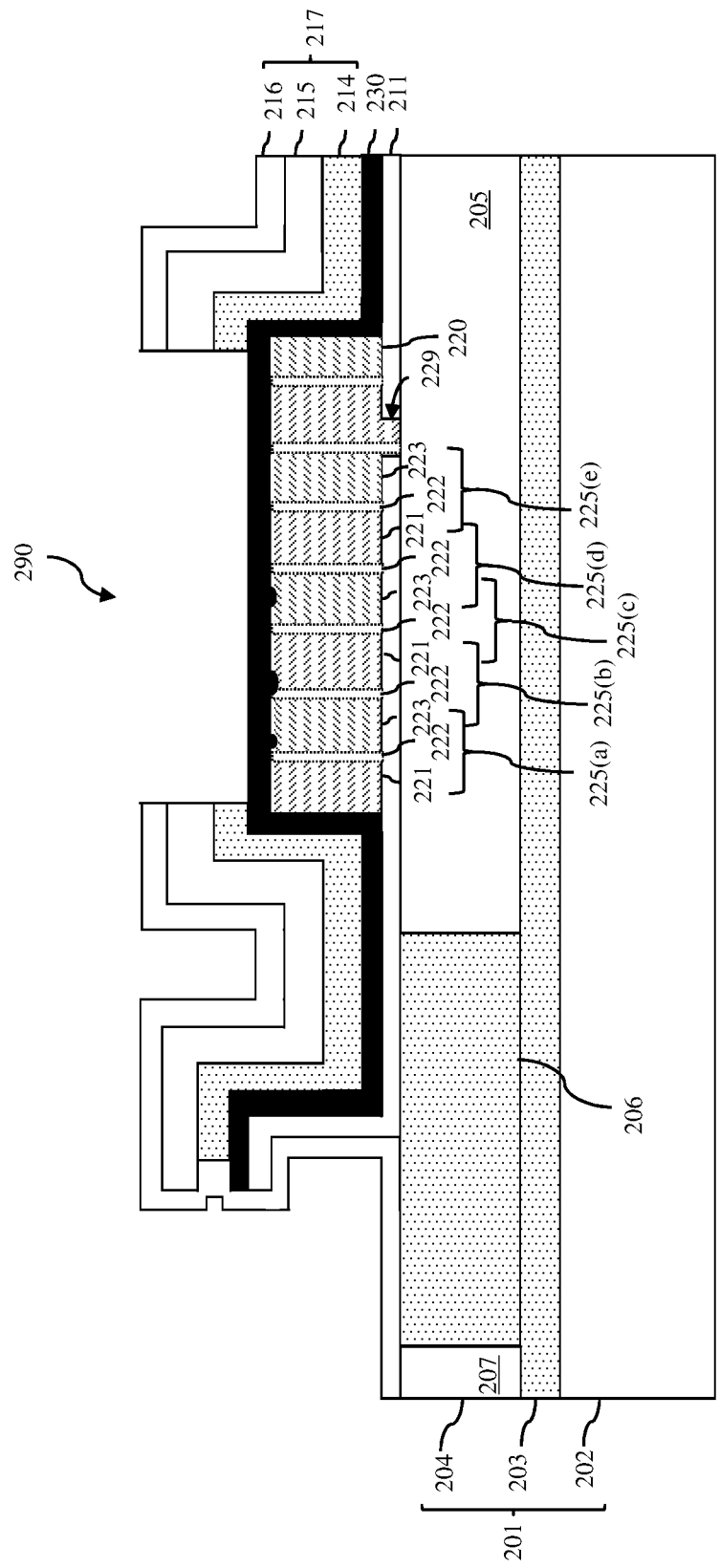
FIG. 18 is a cross-section diagram illustrating a partially completed photodetector structure formed according to the method of FIG. 1.
Figure 19:
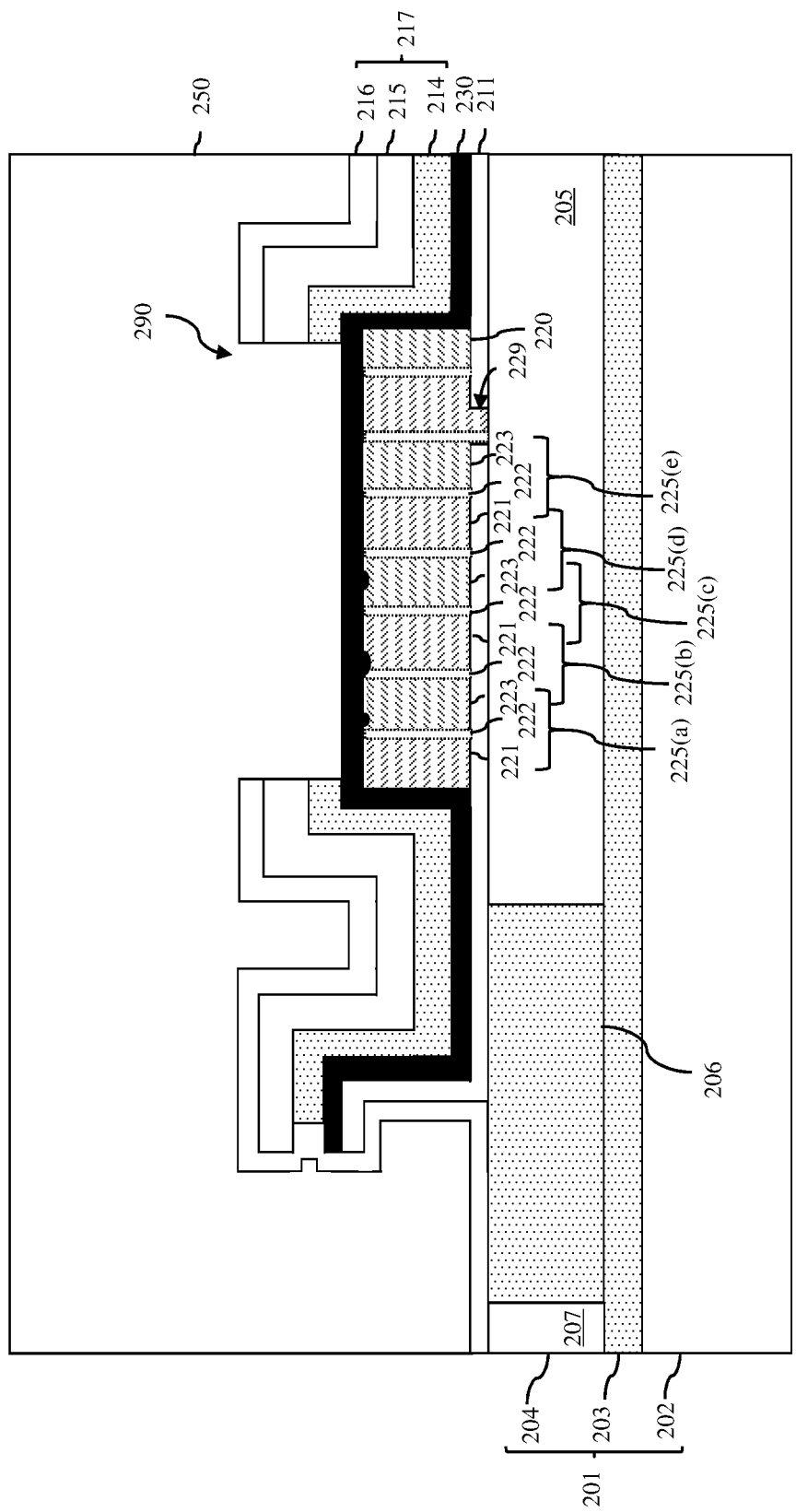
FIG. 19 is a cross-section diagram illustrating a partially completed photodetector structure formed according to the method of FIG. 1; and, FIG. 20 is a cross-section diagram illustrating a photodetector structure with minimal dark current.

Subsequently, an additional opening 290 can be formed (e.g., lithographically patterned and etched) such that it extends vertically through the stack 217 of dielectric layers and exposes a portion of the top surface of the encapsulation layer 230 above the light-absorbing layer 220 (126, see FIG. 18). Then, a blanket layer 250 of interlayer dielectric (ILD) material can be deposited onto the stack 217, filling the additional opening 290. This ILD material can be, for example, silicon oxide or any other suitable ILD material (e.g., borophosphosilicate glass (BPS G), tetraethyl orthosilicate (TEOS), fluorinated tetraethyl orthosilicate (FTEOS), etc.) (128, see FIG. 19).

Figure 20:
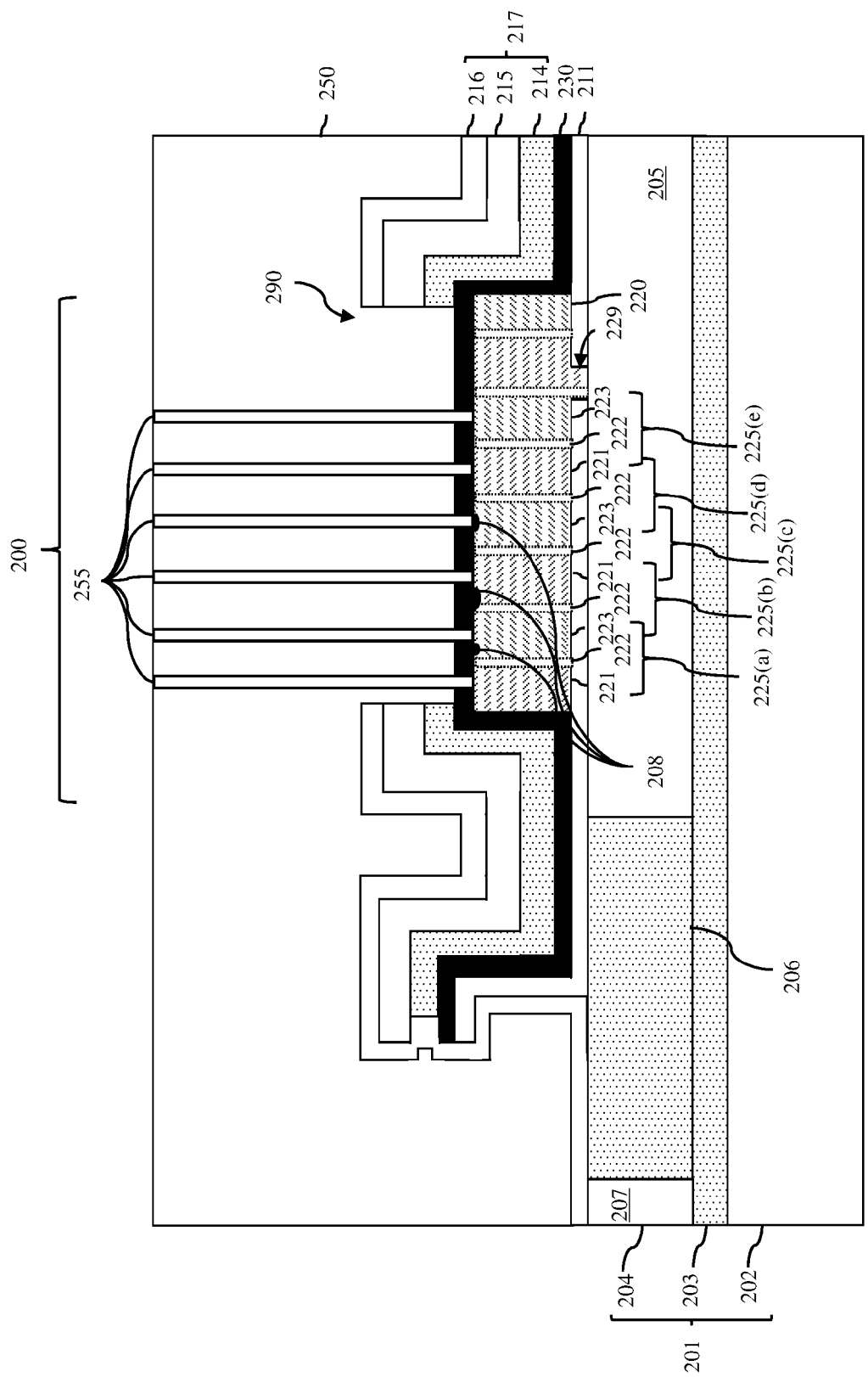

Next, contacts 255 can be formed to the resulting photodetector 200 (130, see FIG. 20). Optionally, during this same contact formation process, additional contacts can also be formed to the other semiconductor devices on the substrate. The contacts 255 and any additional contacts can be formed using conventional contact formation techniques. The contacts 255 can specifically be formed such that they extend vertically through the blanket layer 250 of ILD material within the additional opening 290 and through the encapsulation layer 230 to the diffusion regions 221 and 223 of at least one diode. Those skilled in the art will recognize that, due to the RMG process, the crystalline structure of the light-absorbing layer 220 may contain defects near the interface between the light-absorbing layer 220 interfaces and the monocrystalline semiconductor layer below (i.e., near the opening 290). Thus, preferably only diode(s) that are on one side or the other of the opening 290 are contacted (e.g., see the contacts 255 to the diffusion regions 221 and 223 of each of the diodes 225(a)-(e) on the left side of the opening 290).

Following formation of the contacts 255, conventional back end of the line (BEOL) processing can be performed (132). This BEOL processing can include, but is not limited to, the formation of metal wire(s) and via(s) necessary to electrically connect the photodetector 200 to one or more electronic devices on the same substrate.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Referring to FIG. 20, also disclosed herein is a photodetector 200 having minimal dark current (e.g., a germanium photodetector having dark current of ~1 uA or less).

As discussed above with regard to the method, the photodetector 200 can be formed on a semiconductor-on-insulator (SOI) wafer 201. This SOI wafer 201 can have a semiconductor substrate 202 (e.g., a silicon substrate), an insulator layer 203 on the semiconductor substrate 202 and a monocrystalline semiconductor layer 204 (e.g., a monocrystalline silicon layer) on the insulator layer 203. An isolation region 206 can be in the semiconductor layer 204 above the insulator layer 203 and can define a semiconductor core 205 (e.g., a silicon core) for an optical waveguide (e.g., a silicon optical waveguide). For example, the isolation region 206 can be a conventional shallow trench isolation (STI) region with a trench that defines the outer edges of the semiconductor core 205 for the optical waveguide and with isolation material that fills the trench. It should be noted that this semiconductor core 205 of the optical waveguide can be essentially rectangular in shape, as shown in FIG. 3B. Alternatively, the semiconductor core 205 of the optical waveguide can have at least one tapered (not shown). In any case, the insulator material for the insulator layer 203 and the isolation material for the isolation region 206 can be the same material and specifically can have a lower refractive index than the semiconductor material of the semiconductor core 205. Thus, for example, if the monocrystalline semiconductor layer 204 is silicon, which has a refractive index of approximately 3.5, then the insulator layer 203 and isolation region 206 can be silicon oxide, which has a refractive index of approximately 1.45. It should be noted that, in addition to defining the semiconductor core 205 of an optical waveguide, the isolation region 206 can further define active region(s) of other semiconductor device(s) (e.g., of transistor(s), etc.) on the same SOI wafer 201.

The photodetector 200 can further have a first dielectric layer 211 on the monocrystalline semiconductor layer 204 such that it is above the isolation region 206 and such that it extends laterally over and is immediately adjacent to the semiconductor core 205 of the optical waveguide. The first dielectric layer 211 can have an opening 229 that extends vertically there though to a portion of the monocrystalline semiconductor layer and, particularly, to a portion of the semiconductor core 205.

The photodetector 200 can further have a light-absorbing layer 220 on the first dielectric layer 211 and on the monocrystalline semiconductor layer 204 (i.e., the portion of the semiconductor core 205) within the opening 229. This light-absorbing layer 220 can be monocrystalline in structure. This light-absorbing layer 220 can be, for example, a germanium layer. Alternatively, this light-absorbing layer 220 can be a silicon layer, a silicon germanium layer, an indium gallium arsenide layer or any other suitable light-absorbing layer.

The light-absorbing layer 220 can contain at least one diode (e.g., see diodes 225(a)-(e)). Each diode can be made up of a pair of adjacent diffusion regions with different type conductivities (e.g., a P-type diffusion region 221 and an N-type diffusion region 223). Optionally, each pair of adjacent diffusion regions within each diode can separated by an intrinsic region 222 (i.e., an un-doped region) such that each diode within the light-absorbing layer 220 is a PIN junction diode. As discussed in detail above, the method used to form this photodetector 200 allows for selective control over diode diffusion region formation within the light-absorbing layer 220. Thus, for example, each diffusion region 221 and 223 within each diode within the light-absorbing layer 220 can have a dopant profile with a peak dopant concentration amount of at least $1\times10^{19}$ atoms/cm3 and with a peak dopant concentration location at a depth that is approximately halfway between the bottom surface and the top surface of the light-absorbing layer 220. Furthermore, the number of diffusion regions within the light-absorbing layer 220 of a given length and, thereby the number of diodes within the light-absorbing layer 220 of a given length can be relatively high. For example, the light-absorbing layer 220 can have a length of 20 µm and can contain up to 55 diodes. By ensuring that the diffusion regions 221 and 223 of the diode(s) have a desired dopant profile (e.g., a desired relatively high peak concentration amount of at least $1\times10^{19}$ atoms/cm3, which is located approximately halfway between the bottom and top surfaces of the light-absorbing layer 220) and by maximizing the number of diodes per given length of the light-absorbing layer 220, the amount of dark current that will flow through the resulting photodetector 200 is minimized. For example, in the case of a germanium light-absorbing layer 220, this amount of dark current can be approximately ~1 uA or less.

The photodetector 200 can further have a conformal encapsulation layer 230, which covers the light-absorbing layer 220 (i.e., is on the top surface and sidewalls of the light-absorbing layer 220). As discussed above with regard to the method, this conformal encapsulation layer 230 can be formed following a RMG process that crystallizes the light-absorbing layer 220 and following removal of some or all of one or more strain-relief layers that are used during that RMG process to prevent cracking of the light-absorbing layer 220. Since this conformal encapsulation layer is formed after the RMG process, it does not need to be optimized for strain reduction during RMG and instead can be optimized for one or more other functions within the resulting structure, such as surface pit fill, electrical, optical, barrier, and/or etch stop functions. For example, this conformal encapsulation layer 230 can be immediately adjacent to the light-absorbing layer and can fill in any surface pits 208 on the top surface and/or sidewalls of the light-absorbing layer 220. This conformal encapsulation layer 230 can be a silicon nitride layer or any other suitable layer, such as a polysilicon layer, a silicon germanium layer, a silicon carbide layer, a titanium nitride layer, a tantalum nitride layer or any combination thereof. In any case, this conformal encapsulation layer 230 can be relatively thin. For example, this conformal encapsulation layer 230 can have a third predetermined thickness 231 in the range of 200-600 Å (e.g., the third predetermined thickness can be approximately 400 Å).

The photodetector 200 can further have a stack 217 of dielectric layers on the encapsulation layer 230. This stack 217 can include, but is not limited to, a second dielectric layer 214 immediately adjacent to the encapsulation layer 230 and a third dielectric layer 215 on the second dielectric layer 214. The encapsulation layer 230 can be a different material than the second dielectric layer 214. For example, as mentioned above, the encapsulation layer 230 can be silicon nitride, polysilicon, silicon germanium, silicon carbide, titanium nitride, tantalum nitride or any combination thereof. The second dielectric layer 214 can be a silicon oxide layer. Furthermore, the third dielectric layer 215 and the second dielectric layer 214 can be different dielectric materials. For example, the third dielectric layer 215 can be a silicon nitride layer. The second and third dielectric layers 214-215 can, for example, be optimized for downstream processing and/or optical characteristics (e.g., so that they have a lower refractive index than the light-absorbing layer).

The stack 217 can further include a fourth dielectric layer 216 (e.g., a conformal barrier layer, such as a conformal silicon nitride layer) on the third dielectric layer 215 and extending laterally over the other semiconductor devices. The stack 217 can have an additional opening 290, which extends vertically there through to a portion of the top surface of the encapsulation layer 230 above the light-absorbing layer 220. A blanket layer 250 of interlayer dielectric (ILD) material can cover the stack 217 and can fill this additional opening 290. The ILD material can be, for example, silicon oxide or any other suitable ILD material (e.g., borophosphosilicate glass (BPSG), tetraethyl orthosilicate (TEOS), fluorinated tetraethyl orthosilicate (FTEOS), etc.).

The photodetector 200 can further have contacts 255 that extend vertically through the blanket layer 250 of ILD material within the additional opening 290 and through the encapsulation layer 230 to the diffusion regions 221 and 223 of at least one diode. Those skilled in the art will recognize that the crystalline structure of the light-absorbing layer 220 may contain defects near the interface between the light-absorbing layer 220 and the monocrystalline semiconductor layer below (i.e., near the opening 290). Thus, preferably only the diffusion regions 221 and 223 of diode(s) that are on one side or the other of the opening 290 are contacted (e.g., see the contacts 255 to the diffusion regions 221 and 223 of each of the diodes 225(a)-(e) on the left side of the opening 290).

It should be understood that the terminology used herein is for the purpose of describing the disclosed method and structure and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "on", "in direct contact", "abutting", "directly adjacent to", etc., are intended to indicate that at least one element physically contacts another element (without other elements separating the described elements). The corresponding structures, materials, acts, and equivalents of all means or step plus function elements in the claims below are intended to include any structure, material, or act for performing the function in combination with other claimed elements as specifically claimed.

Therefore, disclosed above are a method of forming a photodetector (e.g., a germanium photodetector) and a resulting photodetector structure with minimal dark current. In the method, a polycrystalline or amorphous light-absorbing layer can be formed on a dielectric layer such that it is in contact with a monocrystalline semiconductor core of an optical waveguide through an opening in the dielectric layer. The light-absorbing layer can then be encapsulated in one or more strain-relief layers and a rapid melting growth (RMG) process can be performed to crystallize the light-absorbing layer. The strain-relief layer(s) can be tuned for controlled strain relief so that, during the RMG process, the light-absorbing layer remains crack-free. The strain-relief layer(s)

can then be removed and a conformal encapsulation layer can be formed over the light-absorbing layer (e.g., filling in any surface pits that developed during the RMG process). Subsequently, dopants can be implanted through the encapsulation layer to form diffusion regions for diode(s) (e.g., PIN diode(s)). Since the encapsulation layer is relatively thin, desired dopant profiles can be achieved within the diffusion regions. By avoiding crack formation in the light-absorbing layer, by filling in surface pits on the light-absorbing layer and/or by achieving desired dopant profiles within the diffusion regions (e.g., N+ and P+ diffusion regions), undesirable dark current is minimized.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A photodetector comprising:
a first dielectric layer on a monocrystalline semiconductor layer, the first dielectric layer having an opening that extends vertically to the monocrystalline semiconductor layer;
a light-absorbing layer on the first dielectric layer and on the monocrystalline semiconductor layer within the opening, the light-absorbing layer being monocrystalline and comprising at least one diode, each diode having diffusion regions, each diffusion region having a dopant profile with a peak dopant concentration located at a depth that is approximately halfway between a bottom surface and a top surface of the light-absorbing layer and a peak dopant concentration amount of at least $1 \times 10^{19}$ atoms/cm$^3$; and
a conformal encapsulation layer covering the light-absorbing layer, the encapsulation layer filling pits on a surface of the light-absorbing layer.

2. The photodetector of claim 1, the encapsulation layer comprising any of a silicon nitride layer, a polysilicon layer, a silicon germanium layer, a silicon carbide layer, a titanium nitride layer, and tantalum nitride layer.

3. The photodetector of claim 1, each diode having an intrinsic region positioned laterally between the diffusion regions.

4. The photodetector of claim 1, the opening having a first side and a second side opposite the first side, the light-absorbing layer having a first portion adjacent to the first side and a second portion adjacent to the second side, and the photodetector further comprising:
a stack of dielectric layers on the encapsulation layer;
an additional opening extending vertically through the stack to the encapsulation layer;
a blanket layer of interlayer dielectric material over the stack and filling the additional opening; and,
contacts extending vertically through the blanket layer in the additional opening and through the encapsulation layer to only the diffusion regions of each diode within the first portion.

5. The photodetector of claim 4, the stack comprising:
a second dielectric layer immediately adjacent to the encapsulation layer;
a third dielectric layer on the second dielectric layer; and
a fourth dielectric layer on the third dielectric layer,
the blanket layer of interlayer dielectric material being immediately adjacent to the fourth dielectric layer,
the second dielectric layer comprising a silicon oxide layer,
the first dielectric layer, the third dielectric layer and the fourth dielectric layer comprising silicon nitride layers, and
the encapsulation layer and the fourth dielectric layer having approximately equal thicknesses.

6. The photodetector of claim 1, the light-absorbing layer comprising a germanium layer.

7. A photodetector comprising:
a first dielectric layer on a monocrystalline semiconductor layer, the first dielectric layer having an opening that extends vertically to the monocrystalline semiconductor layer;
a light-absorbing layer on the first dielectric layer and on the monocrystalline semiconductor layer within the opening, the light-absorbing layer being monocrystalline and comprising multiple diodes, wherein each diode comprises a pair of diffusion regions, wherein adjacent diodes share a diffusion region and wherein each diffusion region is a dopant implant region within the light-absorbing layer; and
a conformal encapsulation layer covering the light-absorbing layer, the encapsulation layer filling pits on a surface of the light-absorbing layer.

8. The photodetector of claim 7, the encapsulation layer comprising any of a silicon nitride layer, a polysilicon layer, a silicon germanium layer, a silicon carbide layer, a titanium nitride layer, and tantalum nitride layer.

9. The photodetector of claim 7, each diffusion region having a dopant profile with a peak dopant concentration located at a depth that is approximately halfway between a bottom surface and a top surface of the light-absorbing layer and a peak dopant concentration amount of at least $1 \times 10^{19}$ atoms/cm$^3$.

10. The photodetector of claim 7, each diode further having an intrinsic region positioned laterally between the diffusion regions.

11. The photodetector of claim 7, the opening having a first side and a second side opposite the first side, the light-absorbing layer having a first portion adjacent to the first side and a second portion adjacent to the second side, and the photodetector further comprising:
a stack of dielectric layers on the encapsulation layer;
an additional opening extending vertically through the stack to the encapsulation layer;
a blanket layer of interlayer dielectric material over the stack and filling the additional opening; and,
contacts extending vertically through the blanket layer in the additional opening and through the encapsulation layer to only the diffusion regions of each diode within the first portion.

12. The photodetector of claim 11, the stack comprising:
a second dielectric layer immediately adjacent to the encapsulation layer;
a third dielectric layer on the second dielectric layer; and
a fourth dielectric layer on the third dielectric layer,
the blanket layer of interlayer dielectric material being immediately adjacent to the fourth dielectric layer,
the second dielectric layer comprising a silicon oxide layer, the first dielectric layer, the third dielectric layer and the fourth dielectric layer comprising silicon nitride layers, and the encapsulation layer and the fourth dielectric layer having approximately equal thicknesses.

13. The photodetector of claim 7, the light-absorbing layer comprising a germanium layer.

14. A photodetector comprising:
a first dielectric layer on a monocrystalline semiconductor layer, the first dielectric layer having an opening that extends vertically to the monocrystalline semiconductor layer;
a light-absorbing layer on the first dielectric layer and on the monocrystalline semiconductor layer within the opening, the light-absorbing layer being monocrystalline and comprising multiple diodes;
a conformal encapsulation layer covering the light-absorbing layer, the encapsulation layer filling pits on a surface of the light-absorbing layer;
a stack of dielectric layers on the encapsulation layer;
an additional opening extending vertically through the stack to the encapsulation layer;
a blanket layer of interlayer dielectric material over the stack and filling the additional opening; and,
contacts extending vertically through the blanket layer in the additional opening and through the encapsulation layer to diffusion regions of each diode.

15. The photodetector of claim 14, the encapsulation layer comprising any of a silicon nitride layer, a polysilicon layer, a silicon germanium layer, a silicon carbide layer, a titanium nitride layer, and tantalum nitride layer.

16. The photodetector of claim 14, each diffusion region of each diode having a dopant profile with a peak dopant concentration located at a depth that is approximately halfway between a bottom surface and a top surface of the light-absorbing layer and a peak dopant concentration amount of at least $1 \times 10^{19}$ atoms/cm$^3$.

17. The photodetector of claim 14, each diode having a pair of diffusion regions and an intrinsic region positioned laterally between the diffusion regions.

18. The photodetector of claim 14, the stack comprising:
a second dielectric layer immediately adjacent to the encapsulation layer;
a third dielectric layer on the second dielectric layer; and
a fourth dielectric layer on the third dielectric layer,
the blanket layer of interlayer dielectric material being immediately adjacent to the fourth dielectric layer,
the second dielectric layer comprising a silicon oxide layer,
the first dielectric layer, the third dielectric layer and the fourth dielectric layer comprising silicon nitride layers, and
the encapsulation layer and the fourth dielectric layer having approximately equal thicknesses.

19. The photodetector of claim 14, the light-absorbing layer comprising a germanium layer.

* * * * *